(12) United States Patent
Hasin et al.

(10) Patent No.: US 9,825,194 B2
(45) Date of Patent: Nov. 21, 2017

(54) SELF ALIGNING SOLDERING

(71) Applicant: Essence Solar Solutions Ltd., Herzlia Pituach (IL)

(72) Inventors: Slava Hasin, Petach-Tikva (IL); Ron Helfan, Tel-Aviv (IL)

(73) Assignee: Essence Solar Solutions Ltd., Herzila Pituach (IL)

( * ) Notice: Subject to any disclaimer, the term of this patent is extended or adjusted under 35 U.S.C. 154(b) by 0 days.

(21) Appl. No.: 13/904,221

(22) Filed: May 29, 2013

(65) Prior Publication Data

US 2013/0323526 A1 Dec. 5, 2013

Related U.S. Application Data

(60) Provisional application No. 61/652,332, filed on May 29, 2012.

(51) Int. Cl.
  *B21D 28/00* (2006.01)
  *H01L 31/052* (2014.01)
  (Continued)

(52) U.S. Cl.
  CPC ............. *H01L 31/052* (2013.01); *B32B 3/06* (2013.01); *B32B 7/12* (2013.01); *H01L 21/683* (2013.01);
  (Continued)

(58) Field of Classification Search
  CPC ......... H01L 2224/12; H01L 2224/4807; H01L 2224/1405; H01L 2224/14051; H01L 24/02; H01L 24/04; H01L 24/05; H01L 24/06; H01L 24/07; H01L 24/12; H01L 23/488; H01L 23/544; H01L 2224/4805; H01L 2924/01074; H01L 2924/01079; H01L 2924/01029; H01L 2924/01013; H05K 1/111; H05K 3/0047; H05K 3/4015; H05K 13/0015; H05K 2201/09381;
  (Continued)

(56) References Cited

U.S. PATENT DOCUMENTS 3,574,333 A 4/1971 Ohara
4,387,413 A 6/1983 Griffis
(Continued)

FOREIGN PATENT DOCUMENTS

EP 0971569 1/2000
EP 1026927 * 9/2000 ............... H05K 1/11
(Continued)

OTHER PUBLICATIONS

Invitation to Pay Additional Fees Dated Jul. 31, 2013 From the International Searching Authority Re. Application No. PCT/IL2013/050459.
(Continued)

*Primary Examiner* — Humera Sheikh
*Assistant Examiner* — Seth Dumbris

(57) ABSTRACT

A substrate pad for soldering at least one self-aligning component thereon, wherein at least one edge of a body of the substrate pad is shaped to conform to a corresponding edge of a component pad, and the at least one edge of the body of the substrate pad further include a plurality of pad fingers leading away from the substrate pad. Related apparatus and methods are also described.

9 Claims, 16 Drawing Sheets

(51) Int. Cl.
*H01L 31/18* (2006.01)
*H01L 21/683* (2006.01)
*H01L 31/0232* (2014.01)
*H01L 33/58* (2010.01)
*B32B 3/06* (2006.01)
*B32B 7/12* (2006.01)
*H05K 13/04* (2006.01)
*H01L 31/02* (2006.01)
*H01L 31/054* (2014.01)
*H05K 1/02* (2006.01)
*H05K 1/05* (2006.01)

(52) U.S. Cl.
CPC .... *H01L 31/02008* (2013.01); *H01L 31/0232* (2013.01); *H01L 31/0543* (2014.12); *H01L 31/18* (2013.01); *H01L 33/58* (2013.01); *H05K 1/0203* (2013.01); *H05K 13/0465* (2013.01); *H01L 2224/48091* (2013.01); *H01L 2224/73265* (2013.01); *H05K 1/05* (2013.01); *H05K 2201/10143* (2013.01); *Y02E 10/52* (2013.01); *Y10T 29/5313* (2015.01); *Y10T 428/12382* (2015.01)

(58) Field of Classification Search
CPC ... H05K 2201/09418; H05K 2203/046; H05K 2203/048
USPC ....... 257/503, 692, 694, 695, 734, 735, 786, 257/779, 797
See application file for complete search history.

(56) References Cited

U.S. PATENT DOCUMENTS

| | | | | |
|---|---|---|---|---|
| 5,053,850 | A * | 10/1991 | Baker et al. | 257/786 |
| 5,357,060 | A * | 10/1994 | Yamashita | 174/267 |
| 5,453,581 | A | 9/1995 | Liebman et al. | |
| 5,498,297 | A | 3/1996 | O'Neill et al. | |
| 5,579,206 | A | 11/1996 | McLellan et al. | |
| 5,859,474 | A * | 1/1999 | Dordi | H01L 23/3128 257/737 |
| 5,872,399 | A * | 2/1999 | Lee | 257/738 |
| 6,069,323 | A | 5/2000 | Slupek et al. | |
| 6,087,596 | A * | 7/2000 | Liu | B23K 1/008 174/260 |
| 6,115,262 | A | 9/2000 | Brunner et al. | |
| 6,147,410 | A * | 11/2000 | Elliott et al. | 257/776 |
| 6,201,305 | B1 * | 3/2001 | Darveaux et al. | 257/779 |
| 6,316,736 | B1 | 11/2001 | Jairazbhoy et al. | |
| 6,350,944 | B1 | 2/2002 | Sherif et al. | |
| 6,853,091 | B2 * | 2/2005 | Miyajima | 257/786 |
| 6,921,018 | B2 * | 7/2005 | Ference et al. | 228/246 |
| 6,969,803 | B2 * | 11/2005 | Shiraki | 174/255 |
| 7,005,750 | B2 * | 2/2006 | Liu | 257/779 |
| 7,042,098 | B2 * | 5/2006 | Harun et al. | 257/774 |
| 7,064,449 | B2 * | 6/2006 | Lin et al. | 257/786 |
| 7,115,819 | B1 * | 10/2006 | Rumsey | 174/261 |
| 7,170,151 | B2 * | 1/2007 | Elpedes | H01L 33/642 257/100 |
| 7,224,073 | B2 * | 5/2007 | Kim | 257/779 |
| 7,276,793 | B2 * | 10/2007 | Sakamoto et al. | 257/739 |
| 7,658,071 | B1 | 2/2010 | McDermott | |
| 7,723,855 | B2 * | 5/2010 | Tsai et al. | 257/786 |
| 7,911,056 | B2 * | 3/2011 | Liu et al. | 257/738 |
| 7,972,875 | B2 | 7/2011 | Rogers et al. | |
| 7,977,567 | B2 | 7/2011 | Bett et al. | |
| 8,026,440 | B1 | 9/2011 | Gordon | |
| 8,093,492 | B2 | 1/2012 | Hering et al. | |
| 8,128,852 | B2 | 3/2012 | Shin et al. | |
| 8,153,886 | B1 | 4/2012 | Garboushian et al. | |
| 8,242,350 | B2 | 8/2012 | Cashion et al. | |
| 8,261,660 | B2 | 9/2012 | Menard | |
| 8,377,358 | B2 | 2/2013 | Keenihan et al. | |
| 2002/0109970 | A1 | 8/2002 | Yang et al. | |
| 2003/0056975 | A1 | 3/2003 | Kochanowski et al. | |
| 2003/0067264 | A1 | 4/2003 | Takekuma | |
| 2003/0140962 | A1 | 7/2003 | Sharps et al. | |
| 2005/0249463 | A1 | 11/2005 | Wilson et al. | |
| 2005/0275079 | A1 | 12/2005 | Stark | |
| 2007/0175655 | A1 | 8/2007 | Swanson et al. | |
| 2008/0185034 | A1 | 8/2008 | Corio | |
| 2008/0190478 | A1 | 8/2008 | Lin | |
| 2008/0190480 | A1 | 8/2008 | Joshi | |
| 2008/0316724 | A1 | 12/2008 | Huang | |
| 2009/0026606 | A1 | 1/2009 | Chen | |
| 2009/0101207 | A1 | 4/2009 | Milbourne et al. | |
| 2009/0107541 | A1 | 4/2009 | Linke et al. | |
| 2009/0114265 | A1 | 5/2009 | Milbourne et al. | |
| 2009/0199890 | A1 | 8/2009 | Hering et al. | |
| 2009/0266593 | A1 * | 10/2009 | Karrer | H01G 2/065 174/260 |
| 2009/0272427 | A1 | 11/2009 | Bett et al. | |
| 2009/0302345 | A1 | 12/2009 | Chuang et al. | |
| 2010/0012171 | A1 | 1/2010 | Ammar | |
| 2010/0037935 | A1 | 2/2010 | Vaid et al. | |
| 2010/0081229 | A1 | 4/2010 | Spare et al. | |
| 2010/0163105 | A1 | 7/2010 | Chuang et al. | |
| 2010/0236603 | A1 | 9/2010 | Menard et al. | |
| 2010/0326492 | A1 | 12/2010 | Tan et al. | |
| 2010/0326494 | A1 | 12/2010 | Okamoto | |
| 2011/0108092 | A1 | 5/2011 | Le Lievre et al. | |
| 2012/0115262 | A1 | 5/2012 | Menard et al. | |
| 2012/0313241 | A1 | 12/2012 | Bower | |
| 2012/0314388 | A1 | 12/2012 | Bower et al. | |
| 2013/0112239 | A1 | 5/2013 | Liptac et al. | |
| 2013/0319507 | A1 | 12/2013 | Hasin et al. | |
| 2013/0320376 | A1 | 12/2013 | Hasin et al. | |

FOREIGN PATENT DOCUMENTS

| | | |
|---|---|---|
| EP | 1959505 | 8/2008 |
| EP | 2254156 | 11/2010 |
| EP | 2312646 | 4/2011 |
| EP | 2482331 | 8/2012 |
| GB | 2313961 | 12/1997 |
| JP | 09-083018 | 3/1997 |
| WO | WO 91/18419 | 11/1991 |
| WO | WO 03/036689 | 5/2003 |
| WO | WO 2008/045187 | 4/2008 |
| WO | WO 2009/144715 | 12/2009 |
| WO | WO 2010/091391 | 8/2010 |
| WO | WO 2011/005486 | 1/2011 |
| WO | WO 2011/036323 | 3/2011 |
| WO | WO 2011/081090 | 7/2011 |
| WO | WO 2013/179286 | 12/2013 |
| WO | WO 2013/179287 | 12/2013 |
| WO | WO 2013/179288 | 12/2013 |

OTHER PUBLICATIONS

International Search Report and the Written Opinion Dated Oct. 1, 2013 From the International Searching Authority Re. Application No. PCT/IL2013/050458.
International Search Report and the Written Opinion Dated Oct. 2, 2013 From the International Searching Authority Re. Application No. PCT/IL2013/050460.
International Search Report and the Written Opinion Dated Oct. 8, 2013 From the International Searching Authority Re. Application No. PCT/IL2013/050459.
Azur Space "Enhanced Fresnel Assembly—EFA. Cell Type: Concentrator Triple Junction Solar Cell—3C40A. Application: Concentrating Photovoltaic COC Assembly. Board Size: 19,6×18,0 mm", Azur Space Solar Power GmbH, 4 P., 2010.
Azur Space "Enhanced Fresnel Assembly—EFA. Cell Type: Concentrator Triple Junction Solar Cell—3C40A. Application: Concentrating Photovoltaic COC Assembly. Board Size: 32,0×37,0 mm", Azur Space Solar Power GmbH, 4 P., 2010.
Longford et al. "Smart Packages for CPV Cell Devices", Global Solar Technology, 3(5): May 10-12, 2010.

(56) References Cited

OTHER PUBLICATIONS

Maxwell "Surface Mount Zero Defect Design Check List", AVX Corporation, Technical Information, 8 P., Feb. 18, 2011.
Suncore "CTJ Receiver Assembly—5.5 mm×5.5 mm", Datasheet, Suncore Photovoltaic Technology Co. Ltd., 1 P., Sep. 2012.
Telecontrolli "A New Phototvoltaic Receiver With Highest Performance and Multiplication Factor", Telecontrolli and System Design R&D, 1 P., 2012.
Official Action Dated Apr. 11, 2014 From the US Patent and Trademark Office Re. U.S. Appl. No. 13/904,205.
Notice of Allowance Dated Jul. 28, 2014 From the US Patent and Trademark Office Re. U.S. Appl. No. 13/904,205.
International Preliminary Report on Patentability Dated Dec. 11, 2014 From the International Bureau of WIPO Re. Application No. PCT/IL2013/050458.
International Preliminary Report on Patentability Dated Dec. 11, 2014 From the International Bureau of WIPO Re. Application No. PCT/IL2013/050459.
International Preliminary Report on Patentability Dated Dec. 11, 2014 From the International Bureau of WIPO Re. Application No. PCT/IL2013/050460.
Restriction Official Action Dated Oct. 22, 2014 From the US Patent and Trademark Office Re. U.S. Appl. No. 13/904,251.
Corrected Notice of Allowability Dated Oct. 30, 2014 From the US Patent and Trademark Office Re. U.S. Appl. No. 13/904,205.
Official Action Dated Aug. 13, 2015 From the US Patent and Trademark Office Re. U.S. Appl. No. 13/904,251.
Official Action Dated Jan. 28, 2015 From the US Patent and Trademark Office Re. U.S. Appl. No. 13/904,251.
Applicant-Initiated Interview Summary Dated Apr. 4, 2016 From the US Patent and Trademark Office Re. U.S. Appl. No. 13/904,251.
Supplementary European Search Report and the European Search Opinion Dated Jan. 18, 2016 From the European Patent Office Re. Application No. 13796763.4.
Official Action Dated Feb. 2, 2016 From the US Patent and Trademark Office Re. U.S. Appl. No. 13/904,251.
Supplementary European Search Report and the European Search Opinion Dated Mar. 8, 2016 From the European Patent Office Re. Application No. 13797461.4.
Official Action Dated Jul. 14, 2016 From the US Patent and Trademark Office Re. U.S. Appl. No. 13/904,251.
Communication Pursuant to Article 94(3) EPC Dated Nov. 14, 2016 From the European Patent Office Re. Application No. 13797339.2. (6 Pages).
Supplementary European Search Report and the European Search Opinion Dated Jan. 5, 2016 From the European Patent Office Re. Application No. 13797339.2.
Communication Pursuant to Article 94(3) EPC Dated Jan. 24, 2017 From the European Patent Office Re. Application No. 13797461.4. (5 Pages).
Applicant-Initiated Interview Summary Dated May 8, 2015 From the US Patent and Trademark Office Re. U.S. Appl. No. 13/904,251.
Communication Pursuant to Article 94(3) EPC Dated Dec. 13, 2016 From the European Patent Office Re. Application No. 13796763.4. (6 Pages).
Examiner-Initiated Interview Summary Dated Nov. 15, 2016 From the US Patent and Trademark Office Re. U.S. Appl. No. 13/904,251. (2 pages).
Notice of Decision from Post-Prosecution Pilot Program (P3) Conference dated Oct. 17, 2016 From the US Patent and Trademark Office Re. U.S. Appl. No. 13/904,251.

\* cited by examiner

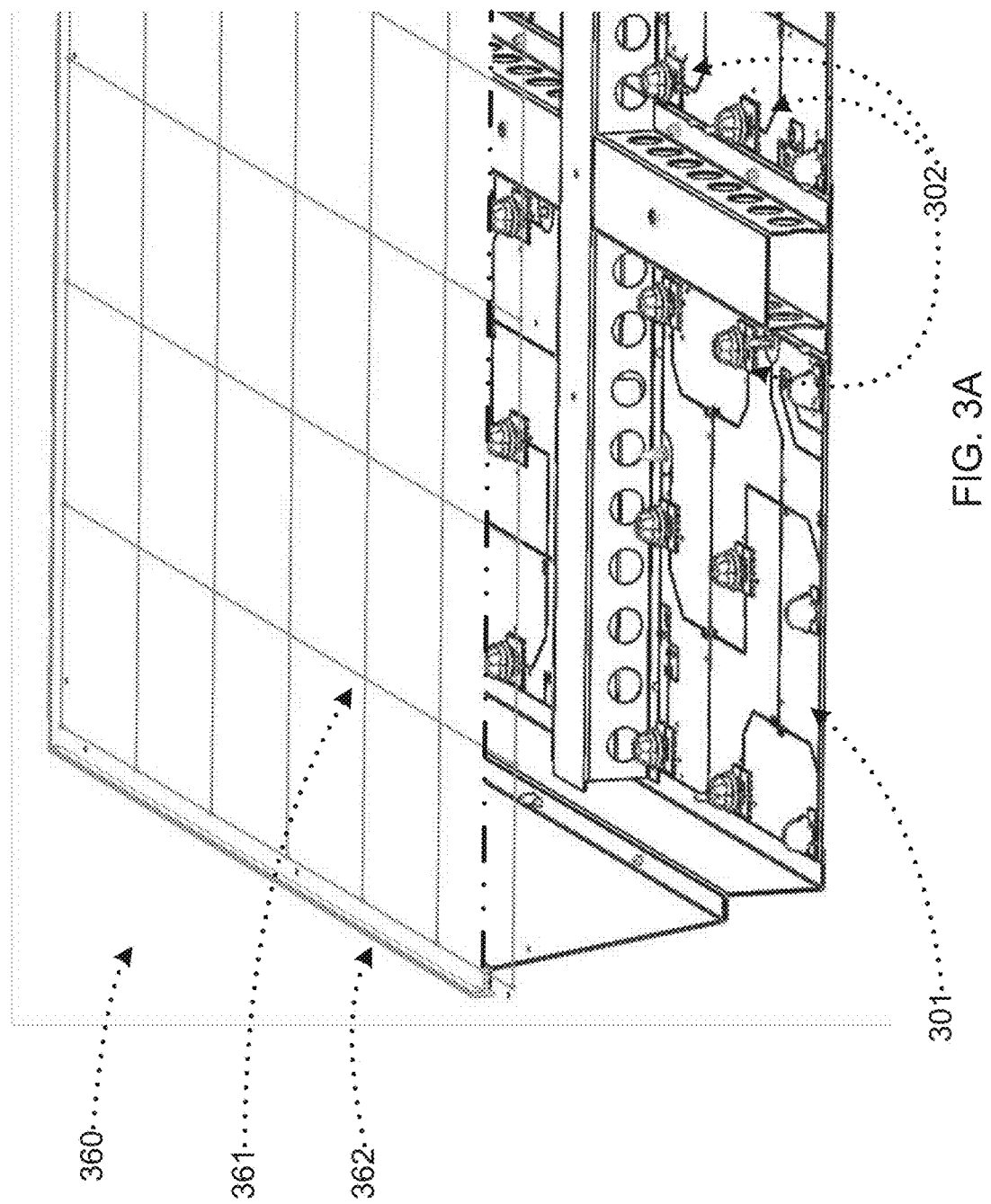

_US 9,825,194 B2_

SELF ALIGNING SOLDERING

RELATED APPLICATIONS

This application claims the benefit of priority under 35 USC §119(e) of U.S. Provisional Patent Application No. 61/652,332 filed May 29, 2012, the contents of which are incorporated herein by reference in their entirety.

This application is also related to co-filed, and co-assigned U.S. and PCT Patent Applications entitled "FRAME HOLDER" (U.S. patent application Ser. No. 13/904,205 filed on May 29, 2013, now U.S. Pat. No. 8,900,911, and PCT Patent Application No. PCT/IL2013/050458 filed on May 29, 2013) by Slava Hasin and Ron Helfan, the disclosures of which are incorporated herein by reference.

This application is also related to co-filed, co-pending and co-assigned U.S. and PCT Patent Applications entitled "PHOTOVOLTAIC MODULE ASSEMBLY" (U.S. patent application No. 13/904,251 and PCT Patent Application No. PCT/IL2013/050459, both filed on May 29, 2013) by Slava Hasin and Ron Helfan, the disclosures of which are incorporated herein by reference.

FIELD AND BACKGROUND OF THE INVENTION

The present invention, in some embodiments thereof, relates to a method for soldering a component to a substrate, and, more particularly, but not exclusively, to a method for Surface Mount Technology (SMT) soldering of a component to a substrate, and, even more particularly, but not exclusively, to a method for accurate alignment of components in a concentrated photovoltaic module.

Some basic terms in soldering are now explained.

Solder is a fusible metal alloy used to join together metal workpieces and having a melting point below that of the workpieces.

Solder paste (or solder cream) is used to connect contacts, typically although not only, leads of surface mount integrated chip packages, to attachment points (lands or pads) in circuit patterns on a Printed Circuit Board (PCB). The solder paste is typically applied to the lands using a stencil to print the paste, although other methods, like dispensing from a tube, are also used.

Reflow soldering is a process in which a solder paste (a sticky mixture of powdered solder and flux) is used to temporarily attach one or several electrical components to their contact pads, after which the entire assembly is subjected to controlled heat, which melts the solder, permanently connecting the joint.

Solder, when melted for purpose of soldering, adheres to contacts and pads, which are typically metallic, and typically does not easily adhere to surrounding PCB or plastic. The molten solder easily flows along the pads and metal conductors.

A typical soldering of a component to a substrate involves placing solder between the component contact and a pad on the substrate, and heating the component and the substrate to melt the solder. The solder adheres to the contact and the pad, and when the solder cools and solidifies, the component becomes attached to the substrate by soldering. Having too much solder can cause excess solder to flow along bare pads or contact or conductors. If no such bare surfaces are available, the molten solder may float the component away from alignment to the substrate pad.

Background art includes:

an article titled "Surface Mount Zero Defect Design Check List" by John Maxwell of AVX Corporation, published on the World Wide Web at URL http://wwwdotelement14dotcom/community/docs/DOC-28004/1/surface-mount-zero-defect-design-check-list, on 18 Feb. 2011;

an article titled "Smart packages for CPV cell devices" by Andy Longford, consultant, and Domenic Federici, published in Global Solar Technology—May 2010;

an article titled "A new photovoltaic receiver with the highest performance and multiplication factor", describes a product which was planned to be brought to market The receiver will be brought to the market beginning from October 2012, published on the World Wide Web at URL http://wwwdotcpvsolarcelldoteu/en/cpv-solar-cell-home/27-news-sul-cpv/69-a-new-photovoltaic-receiver-with-the-highest-performance-and-multiplication-factordothtml;

A data sheet for an Enhanced Fresnel Assembly 3C40A, published on the World Wide Web at URL
http://wwwdotazurspacedotcom/images/pdfs/CPV%20TJ%20Solar%20Cell%203C40A%2032x37mmdotpdf; and A data sheet for an Enhanced Fresnel Assembly 3C40A, published on the World Wide Web at URL
http://wwwdotazurspacedotcom/images/pdfs/CPV%20TJ%20Solar%20Cell%203C40A%2032x37mmdotpdf.

The disclosures of all references mentioned above and throughout the present specification, as well as the disclosures of all references mentioned in those references, are hereby incorporated herein by reference.

SUMMARY OF THE INVENTION

The present invention, in some embodiments thereof, relates to a method of designing a substrate pad, for soldering a component thereon.

The substrate pad produced by the above design potentially leads to a better attachment of the component to the substrate, and/or to more accurate alignment of the component relative to its intended and/or optimal location on the substrate.

In some embodiments, the substrate pad enables assembly of components onto the substrate using standard SMT processes and stencils, without special-purpose machines and tooling.

In some embodiments, the substrate pad design includes substrate pad extensions, termed herein fingers, or pad fingers, or pad teeth, in the substrate pad.

In some embodiments the pad fingers are used to lead excess solder away from beneath the component, preventing the component from suffering from problems typical of excess solder. Leading excess solder away from the component-substrate interface enables the amount of solder paste used for soldering to be less accurately controlled, preferable erring to provide an excess of solder paste.

When printing solder paste onto solder pads on a substrate for a component with two bottom pads, for example, the amount of solder paste may vary between pads. Therefore, in prior art, substrate pads are usually intentionally larger than the component's pad in order to enable excess solder paste to reach and provide area for such excess to solidify. However, such a solution enables freedom of movement for the component, and a loosening of tolerances in a final location of the component relative to its nominal location. Without pad fingers leading excess solder away, a height difference between component pads might be produced, and the component may be tilted. With pad fingers this phenomenon is lessened. A component tends to be soldered flat if excessive solder from the pad area is enabled to flow out.

Two terms are used in the present application: substrate pad, and component pad. It is to be appreciated that in a soldering process, sometimes naming one side of the soldered attachment a substrate and one side a component may be artificial. In such artificial cases, a person skilled in the art will appreciate that it does not matter which is the substrate and which is the component. However, typically, one side is the substrate and one side is a component, and a person skilled in the art knows which is which.

The term substrate pad is used herein to describe a pad on the substrate, usually metallic, to which molten solder adheres in the process of soldering.

The term component pad is used herein to describe a portion of a terminal on the component, usually metallic, to which molten solder adheres in the process of soldering. Furthermore, the term component pad is used herein to refer to the portion of the component connector which is designed to overlap the substrate pad when the component is soldered to the substrate.

It is noted that where soldering is referred to in the specification and/or the claims, the process of reflow soldering should be understood to also apply.

A body of a pad is defined herein as a contour of the pad excluding the pad fingers. In some embodiments, a pad includes both a body and fingers.

In some embodiments, the body of the substrate pad is shaped to be equal to a shape of a corresponding component pad on the component being soldered to the substrate pad. Surface tension of molten solder, which adheres to the substrate pad and to a pad of the component being soldered, aligns the component pad exactly to the substrate pad.

It is noted that the above description of the substrate pad shape and area as equal to the component pad shape and area may be understood as equal but for production tolerances.

The above design of a substrate pad equal to the component pad shape and area is in contrast to typical pad designs, in which substrate pads are larger than component pads, to allow for an entire surface of the component pad to be over the substrate pad despite possible inaccuracies in placement of the component, and to allow room for solder fillets to be produced, adhering to the larger pad.

In some embodiments, an arrangement of substrate pad fingers is optionally provided symmetrically around the substrate pad. The substrate pad fingers not only lead excess solder away from the component/substrate interface, but also provide symmetrical surface tension forces helping to align the component on the substrate pad, and/or preventing a misalignment of the component due to asymmetrical surface tension forces applied to the component while the solder is molten. Molten solder adheres to the component pad and to the substrate pad, and aligns the edge of the component with the edge of the pad.

In some embodiments, the substrate pad has room for solder fillets only on the pad fingers.

In some embodiments, solder fillets are found on the substrate pad fingers, since the component pad is same-sized as the substrate pad.

In some embodiments, because of manufacturing tolerances, the components pads and the substrate pads may not be exactly equal, and small solder fillets appear, due to the dimension differences. Because of symmetrical surface tension forces applied, the small fillets tend to be symmetrical as well in all directions.

In some embodiments it is not an entire substrate pad which is same-sized as the component pad, but at least one edge of the substrate pad is parallel to a corresponding edge of the component pad.

According to an aspect of some embodiments of the present invention there is provided a substrate pad for soldering at least one self-aligning component thereon, wherein at least one edge of a body of the substrate pad is shaped to conform to a corresponding edge of a component pad, and the at least one edge of the body of the substrate pad further include a plurality of pad fingers leading away from the substrate pad.

According to some embodiments of the invention, the at least one edge of the body of the substrate pad includes at least two edges of the body of the substrate pad shaped to conform to at least two corresponding edges of the component pad.

According to some embodiments of the invention, the at least two edges of the body of the substrate pad include at least two opposite edges, a distance between the at least two opposite edges of the body of the substrate pad is equal to a distance between corresponding edges of the component pad, and there are pad fingers on the two opposite edges of the body of the substrate pad.

According to some embodiments of the invention, the substrate pad area and shape within the body of the substrate pad is equal in area and shape to the component pad.

According to some embodiments of the invention, a width of the pad fingers is smaller than a width of a space between two pad fingers. According to some embodiments of the invention, a sum of widths of the pad fingers along an edge of the substrate pad is smaller than half of a length of the same edge of the body of the substrate pad.

According to some embodiments of the invention, the substrate pad has room for solder fillets on the pad fingers.

According to some embodiments of the invention, there are pad fingers on three edges of the body of the substrate pad.

According to some embodiments of the invention, the body of the substrate pad is a rectangle. According to some embodiments of the invention, the body of the substrate pad is a polygon.

According to some embodiments of the invention, the component pad shape is oval, and the edges of the body of the substrate pad are shaped to conform to corresponding edges of the oval component pad, and the edges of the body of the substrate pad further include a plurality of pad fingers leading away from the oval substrate pad.

According to an aspect of some embodiments of the present invention there is provided a method for attaching and aligning a component to a substrate, the method including providing a substrate pad, wherein at least one edge of a body of the substrate pad is shaped to conform to a corresponding edge of a component pad, and the at least one edge of the body of the substrate pad further includes a plurality of pad fingers leading away from the body of the substrate pad, providing solder to at least one of the substrate pad and the component pad, and melting the solder, thereby causing the solder to exert force on the component and on the substrate and align the component pad to the substrate pad.

According to some embodiments of the invention, the providing solder includes providing solder paste on the at least one of the substrate pad and the component pad to cover the at least one of the substrate pad and the component pad up to a distance in a range of 2 to 20 mils from an edge of the at least one of the body of the substrate pad and an edge of the component pad.

According to some embodiments of the invention, the providing solder includes providing solder paste in an amount sufficient for solder after melting to covering body of the substrate pad in a thickness of at least 1 mil, and to build solder fillets on the plurality of pad fingers.

According to some embodiments of the invention, the providing solder includes providing solder paste in an amount so as to prevent solder bridging between pad fingers.

According to some embodiments of the invention, the at least one edge of the body of the substrate pad includes at least two edges of the body of the substrate pad shaped to conform to at least two corresponding edges of the component pad.

According to some embodiments of the invention, the at least two edges of the body of the substrate pad include at least two opposite edges, a distance between the at least two opposite edges of the body of the substrate pad is equal to a distance between corresponding edges of the component pad, and there are pad fingers on the two opposite edges of the body of the substrate pad.

According to some embodiments of the invention, the substrate pad area and shape within the body of the substrate pad is equal in area and shape to the component pad.

According to some embodiments of the invention, a width of the pad fingers is smaller than a width of a space between two pad fingers. According to some embodiments of the invention, a sum of widths of the pad fingers along an edge of the substrate pad is smaller than half of a length of the same edge of the body of the substrate pad.

According to some embodiments of the invention, the substrate pad has room for solder fillets on the pad fingers.

According to some embodiments of the invention, a plurality of substrate pads are provided and a plurality of component pad are soldered to the plurality of substrate pads.

According to an aspect of some embodiments of the present invention there is provided a combination of a substrate having a substrate pad for soldering the component thereon and a component, the combination including a substrate which includes a substrate pad, a component which includes a component pad, and the substrate pad area and shape within the body of the substrate pad is equal in area and shape to the component pad.

According to an aspect of some embodiments of the present invention there is provided a method of assembling a concentrated solar photovoltaic module including providing a backplane with at least one substrate pad, wherein at least two opposite edges of a body of the substrate pad are shaped to conform to corresponding edges of a component pad on a first component, a distance between the at least two opposite edges of the body of the substrate pad is equal to a distance between the corresponding edges of the first component pad, and the at least two opposite edges of the body of the substrate pad further include a plurality of pad fingers leading away from the substrate pad, and soldering the first component to the substrate pad.

According to some embodiments of the invention, the substrate pad area and shape within the body of the substrate pad is equal in area and shape to the component pad. According to some embodiments of the invention, the substrate pad has room for solder fillets on the pad fingers.

According to some embodiments of the invention, the first component includes a solar cell receiver. According to some embodiments of the invention, the first component includes a solar cell. According to some embodiments of the invention, the first component includes a mounting frame for a secondary optical component.

According to some embodiments of the invention, further including the first component having at least one first component substrate pad thereon, wherein at least two opposite edges of a body of the first component substrate pad are shaped to conform to corresponding edges of a second component pad on a second component, a distance between the at least two opposite edges of the body of the first component substrate pad is equal to a distance between the corresponding edges of the second component pad, and the at least two opposite edges of the body of the first component substrate pad further include a plurality of pad fingers leading away from the first component pad, and soldering the second component to the first component substrate pad, wherein the second component includes a secondary optical component.

According to some embodiments of the invention, the second component includes a solar cell. According to some embodiments of the invention, the second component includes a mounting frame for a secondary optical component.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the invention are herein described, by way of example only, with reference to the accompanying drawings and images. With specific reference now to the drawings and images in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 3A is a simplified isometric illustration of a concentrated photovoltaic module designed and constructed according to an example embodiment of the invention;

DESCRIPTION OF SPECIFIC EMBODIMENTS OF THE INVENTION

The present invention, in some embodiments thereof, relates to a method for soldering a component to a substrate, and, more particularly, but not exclusively, to a method for Surface Mount Technology (SMT) soldering of a component to a substrate, and, even more particularly, but not exclusively, to a method for accurate alignment of components in a concentrated photovoltaic module.

Figure 1A:
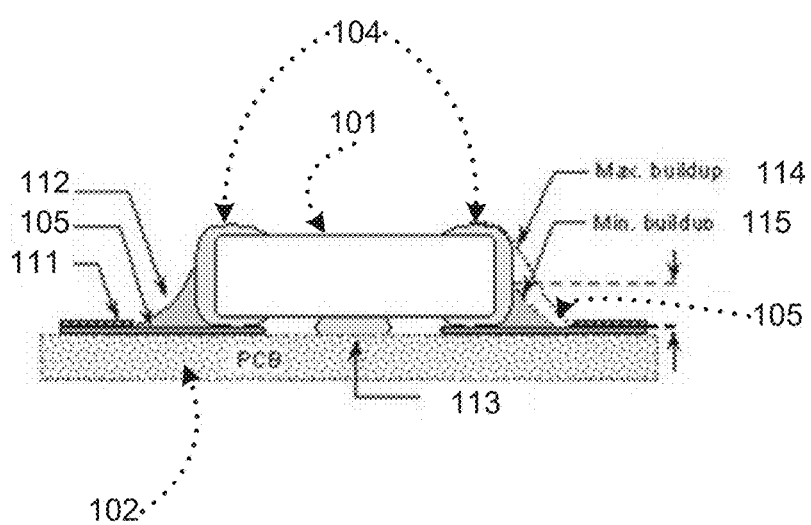
FIG. 1A is a simplified cross sectional illustration of a component and a substrate according to prior art.

For purposes of better understanding some embodiments of the present invention, reference is first made to FIG. 1A, which is a simplified illustration of a component 101 and a substrate 102 according to prior art.

FIG. 1A depicts a component 101 which has two terminals 104, for soldering to two substrate pads 105.

FIG. 1A depicts an example component 101 which has two terminals 104, and a substrate 102 which has two substrate pads 105, to which component pads (not shown, they are the bottom of the component terminals 104, which abut the substrate pads 105) are attached.

It is noted that the substrate pads 105 are larger than the component pads. Being larger, they enable some error in alignment of the component, and yet still provide substrate pad contact with the full area of the component pads.

It is noted that a component may have 1 or more component pads, and a corresponding substrate may have 1 or more substrate pads.

Also shown in FIG. 1A is a spot of adhesive 113, which is optionally used to hold the component 101 in place during the process of soldering.

Also shown in FIG. 1A is a layer of resist 111 or solder mask, which may optionally cover a portion of a substrate pad 105, limiting the extent to which solder may adhere.

Also shown in FIG. 1A is a solder fillet 112. The solder fillet 112 depicts what a good solder joint typically looks like. Solder adheres to a portion of a substrate pad 105, to a contact pad on a bottom of the terminal 104, and climbs up the side of the terminal 104. Also shown are two examples of a maximal acceptable buildup of a solder fillet 114 and a minimal acceptable buildup of a solder fillet 115.

Figure 1B:
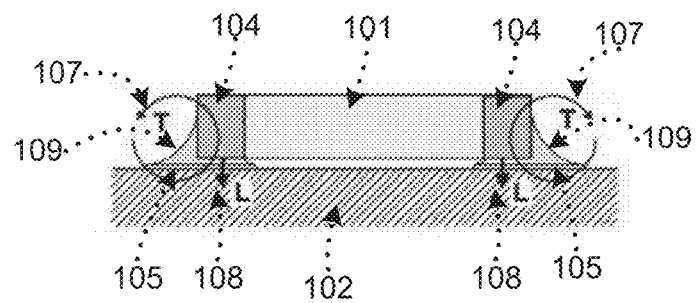
FIG. 1B is another simplified cross sectional illustration of the component and substrate of FIG. 1A.

Reference is now made to FIG. 1B, which is a simplified cross sectional illustration of the component 101 and substrate 102 of FIG. 1A.

FIG. 1B depicts the component 101, the substrate 102, the terminals 104 and the substrate pads 105 of FIG. 1A.

FIG. 1B also depicts some forces which molten solder effects upon the component 101.

One force is a force of adhesion 108 of the component pad portion of the component terminal to the substrate pad 105.

Another force is a surface tension force 107 due to surface tension of the solder 109 adhering to sides of the terminal 104 and to the substrate pad 102.

Another force is simply the weight of the component 101, which presses it against the substrate 102.

Another force may be a flotation force (not shown) which may occur if excess solder is present beneath the component pads and is not led away.

Figure 1C:
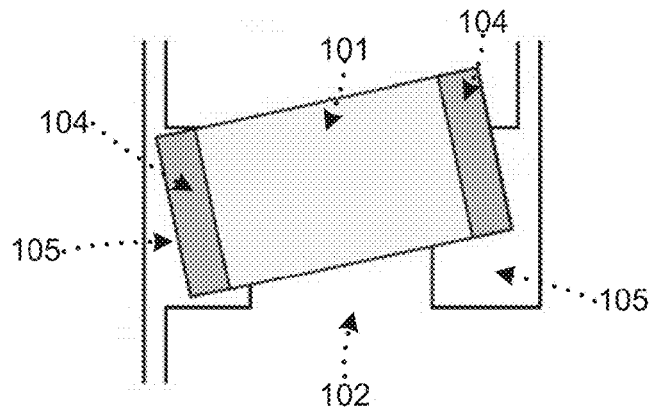
FIG. 1C is a simplified illustration of a component and a substrate, with the component attached to the substrate misaligned.

Reference is now made to FIG. 1C, which is a simplified illustration of a component 101 and a substrate 102, with the component 101 attached to the substrate 102 misaligned.

Some of the parts depicted in FIGS. 1A and 1B are also depicted in FIG. 1C: the component 101, the substrate 102, the terminals 104 and the substrate pads 105.

The misalignment depicted in FIG. 1C may be caused by poor placement of the component 101 and component pads on the substrate pads 105. Misalignment may also be caused by component rotation, for example the substrate pad 105 is large enough to allow the component 101 to rotate during the reflow cycle, when the solder is molten. In addition, if there is excess solder paste on at least one of the pads, which does not have where to drain, a difference in heights between the two solder joints may be formed, and the difference in heights may also cause such rotation.

Misalignment can be described in terms of X and/or Y and/or Z translation from a correct placement; by an angle of rotation from a correct placement; and by an angle of the component pad from a parallel alignment to the substrate pad (not shown).

In some embodiments, the force exerted by molten solder adhering to a substrate pad and to a component terminal is used to align the component to the substrate pad. Such alignment is termed herein self-alignment.

In some embodiments, the size and shape of the substrate pad is made equal to the size and shape of the component pad, that is, the side of the component which adheres to the substrate pad. The equal size and shape enables alignment of the component and the substrate pad in a state of equilibrium, when the solder is molten and the component may still move relative to the substrate.

In some embodiments, fingers of the pad material extend outward from the pad, leading excess solder away from the component to substrate pad interface, and optionally providing an area on which solder fillets form against the side of the component terminal.

Accurate alignment is achieved by using self-alignment, often better than other methods of pick and place, and cheaper than such methods, since producing accurately aligned substrate pads on a substrate is typically cheaper than accurately placing components on a substrate. Furthermore, self-alignment corrects alignment when the solder is molten, while typically, when not using the self-alignment technique, even accurately placed components may shift from accurate alignment when solder is melted.

A further potential benefit of such alignment is that if substrate pads are produced on a substrate or backplane, components are aligned with each other accurately.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

As described above in the Summary of the Invention, the present invention, in some embodiments thereof, relates to a method of designing a substrate pad, for soldering a component thereon.

In some embodiments, the substrate pad is shaped, except for optional pad fingers, equal to a corresponding component pad on the component being soldered to the pad. Surface tension of molten solder, which adheres to the substrate pad and to a pad of the component being soldered, aligns the component pad exactly to the substrate pad.

In some embodiments, the substrate pad design includes substrate pad extensions, termed herein fingers, or pad fingers, in the substrate pad.

In some embodiments the pad fingers are used to lead excess solder away from beneath the component, enabling to dispense more solder paste than a minimum required for each pad, optionally dispensing any amount within a range, since the pad fingers will lead excess solder away from the substrate pad. The pad fingers enables rougher, less precise application of the solder paste, for example in terms of surface planarity, parallelism to the pad, all the while preventing the component from suffering from misalignment and other problems typical of excess solder and/or insufficient solder. Leading excess solder away from the component-substrate interface enables the amount of solder paste used for soldering to be less accurately controlled, preferable erring to provide an excess of solder paste.

In some embodiments, an arrangement of substrate pad fingers is optionally provided symmetrically around the substrate pad. The substrate pad fingers not only lead excess solder away from the component/substrate interface, but also provide symmetrical surface tension forces helping to align the component on the substrate pad, and/or preventing a misalignment of the component due to asymmetrical surface tension forces applied to the component while the solder is molten. Molten solder adheres to the component pad and to the substrate pad, and aligns the edge of the component with the edge of the pad.

In some embodiments, solder fillets are found on the substrate pad fingers, since the component is same-sized as the substrate pad.

In some embodiments it is not an entire substrate pad which is same-sized as the component pad, but one edge of the body of the substrate pad is parallel to a corresponding edge of the component pad. In such a case, the component will be aligned with the edge of the body of the substrate pad, and may, or may not, have a degree of freedom in moving in a direction parallel to the edge of the body of the substrate pad.

Figure 1D:
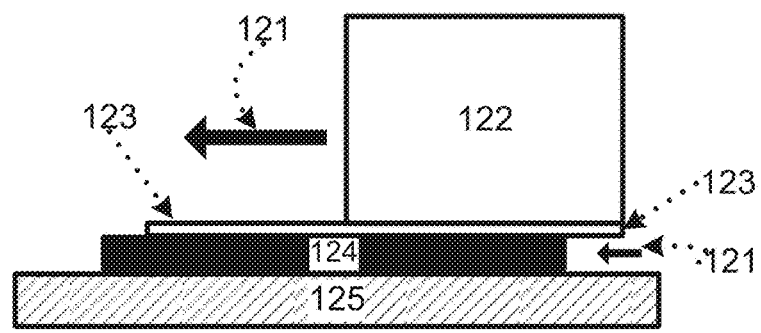
FIG. 1D is a simplified cross-sectional illustration of an aligning force acting on a component adhering via molten solder to a substrate pad on a substrate, when the component is misaligned with the substrate pad, according to an example embodiment of the invention.

Reference is now made to FIG. 1D, which is a simplified cross-sectional illustration of an aligning force 121 acting on a component 122 adhering via molten solder 123 to a substrate pad 124 on a substrate 125 according to an example embodiment of the invention.

FIG. 1D depicts molten solder 123 adhering to a bottom of the component 122, and adhering to the substrate pad 124. The molten solder adheres to the bottom of the component 122 and to the substrate pad 124 and applies the force 121 in order to reduce surface tension.

Figure 1E:
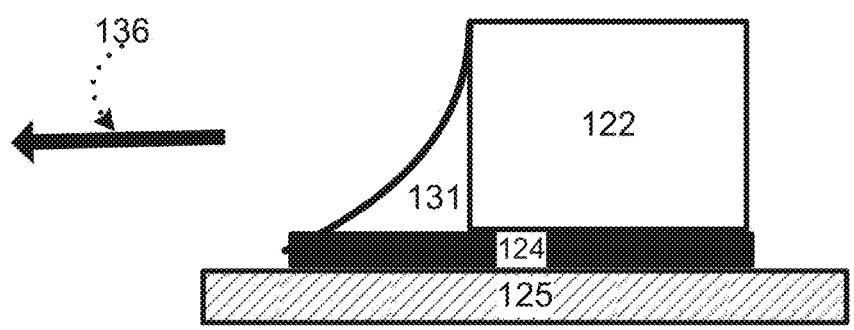
FIG. 1E is a simplified cross-sectional illustration of an aligning force acting on a component adhering via molten solder to a substrate pad on a substrate, when the component is aligned with the substrate pad, according to an example embodiment of the invention.

Reference is now made to FIG. 1E, which is a simplified cross-sectional illustration of an aligning force acting on a component adhering via molten solder to a substrate pad on a substrate, when the component is aligned with the substrate pad, according to an example embodiment of the invention.

FIG. 1E depicts solder joint in which was used an amount of molten solder 131 which would produce a good solder joint, similar to the solder fillet 112 of FIG. 1A. Surface tension causes the molten solder 131 to pull on the component 122, exerting a force 136.

FIGS. 1D and 1E depicted forces which act on the component while the solder is molten. Below are described arrangements of substrate pads which use the force of molten solder to align components exactly to their substrate pads.

Figure 1F:
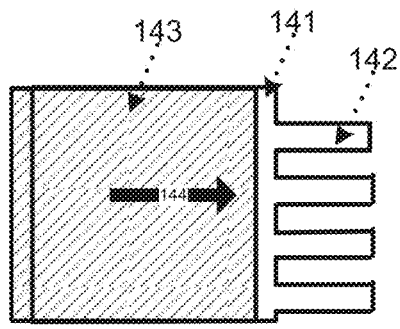
FIG. 1F is a simplified illustration of an aligning force acting on a component pad adhering via molten solder to a substrate pad having several pad fingers according to an example embodiment of the invention.

Reference is now made to FIG. 1F, which is a simplified illustration of an aligning force 144 acting on a component pad 143 adhering via molten solder to a substrate pad 141 having several pad fingers 142 according to an example embodiment of the invention.

FIG. 1F depicts the component pad 143 somewhat misaligned relative to the substrate pad 141. However, the shape and area of the component pad 143 is equal to the shape and area of the substrate pad 141. There are small, if any, solder fillets around the component, except on the pad fingers 142. The net force 144 on the component pad 143 is to pull it along toward the edge of the substrate pad 141 with the pad fingers 142. When the solder flows along the pad fingers 142, a pull force acts on the component, which "floats" on the molten solder.

In some embodiments, the width of the pad fingers 142 is designed to be smaller than the width of the spaces between the pad fingers 142. Such a design has been found to lower the probability that solder will bridge the space between the pad fingers 142.

Figure 1G:
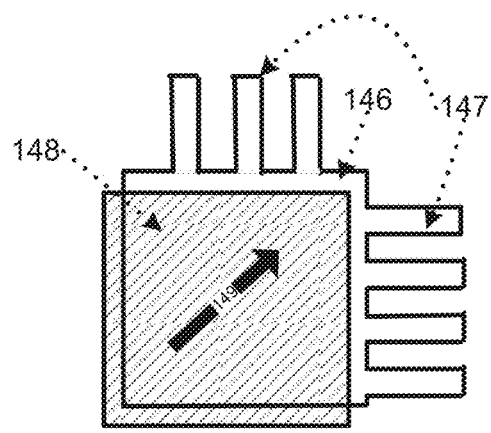
FIG. 1G is a simplified illustration of an aligning force acting on a component pad adhering via molten solder to a substrate pad having several pad fingers according to an example embodiment of the invention.

Reference is now made to FIG. 1G, which is a simplified illustration of an aligning force 149 acting on a component pad 148 adhering via molten solder to a substrate pad 146 having several pad fingers 147 according to an example embodiment of the invention.

FIG. 1G depicts the component pad 148 somewhat translationally misaligned relative to the substrate pad 146. However, the shape and area of the component pad 148 is equal to the shape and area of the substrate pad 146. There are small, if any, solder fillets around the component, except on the pad fingers 147. The net force 149 on the component pad 148 is to pull it along toward the edges of the substrate pad 146 with the pad fingers 147.

Figure 1H:
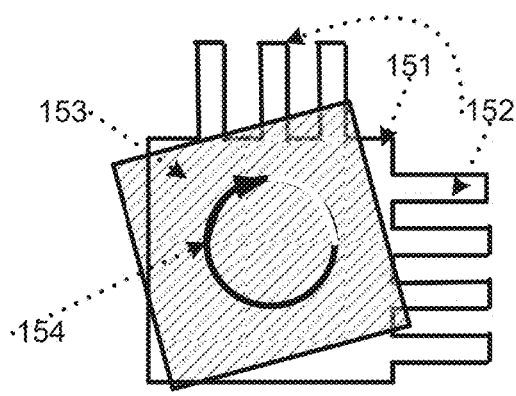
FIG. 1H is a simplified illustration of an aligning force acting on a component pad adhering via molten solder to a substrate pad having several pad fingers according to an example embodiment of the invention.

Reference is now made to FIG. 1H, which is a simplified illustration of an aligning force 154 acting on a component pad 153 adhering via molten solder to a substrate pad 151 having several pad fingers 152 according to an example embodiment of the invention.

FIG. 1H depicts the component pad 153 somewhat rotationally misaligned relative to the substrate pad 151. However, the shape and area of the component pad 153 is equal to the shape and area of the substrate pad 151. There are small, if any, solder fillets around the component, except on the pad fingers 152. The net force 154 on the component pad 153 is to pull and rotate it along toward the edges of the substrate pad 151 with the pad fingers 152.

In some embodiments, the pad fingers are shaped as rectangles.

In some embodiments, the pad fingers are wider at an edge of the substrate pad, and become narrower the further they extend from the body of the substrate pad.

In some embodiments, the pad fingers are narrower at an edge of the substrate pad, and become wider the further they extend from the body of the substrate pad.

Figure 2A:
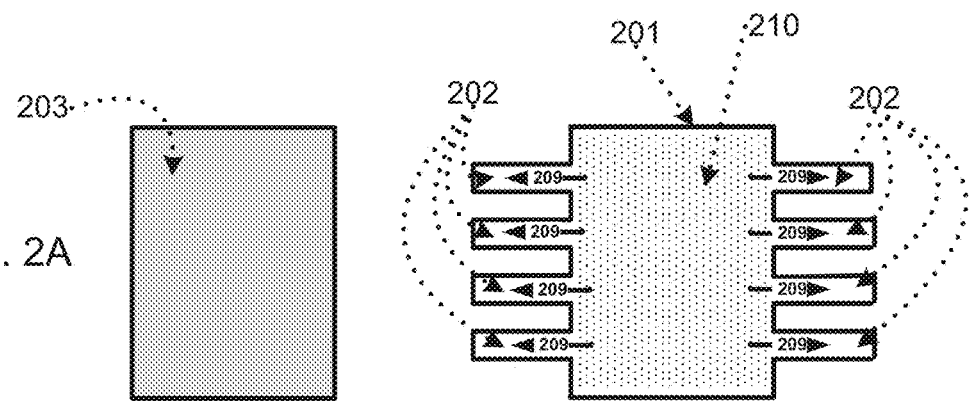
FIG. 2A is a simplified illustration of a component pad and a substrate pad according to an example embodiment of the invention.

Reference is now made to FIG. 2A, which is a simplified illustration of a component pad 203 and a substrate pad 201 according to an example embodiment of the invention.

FIG. 2A depicts the substrate pad 201 having a body 210 having a same shape, same area as the component pad 203.

The body 210 of the substrate pad 201 is shaped, except for optional pad fingers 202, to be equal in size and shape, to a corresponding component pad 203 on a component being soldered to the substrate pad.

FIG. 2A also depicts directions 209 of surface tension forces, which would act along the pad fingers 202 when the component pad 203 is placed on the substrate pad 201 and molten solder is between the component pad 203 and the substrate pad 201. The surface tension forces apply along the direction 209 of the pad fingers 202, and where there are no pad fingers 202, a surface tension force in the direction 209 does not apply.

In the example depicted in FIG. 2A, the forces will be equal in both directions, since there are optionally an equal number of pad fingers 202, of equal width, on both sides of the substrate pad 201.

It is noted that the substrate pad 201 shape and size may be limited and defined by an extent of the substrate pad material itself, or the shape and size may be defined by a top layer of resist 111, as depicted in FIG. 1A.

In some embodiments, the body 210 of the substrate pad 201 and the pad fingers 202 are defined in a Non Solder Mask Definition (NSMD) process.

Using the NSMD process results in pad dimensions being defined by a pad production technique which includes, by way of a non-limiting example, etching and/or electroplating. Manufacturing tolerances of the NSMD process are from +/− a few microns (electroplating) to about +/−50 microns (etching).

In some embodiments, the body 210 of the substrate pad 201 and the pad fingers 202 are defined in a Solder Mask Definition (SMD) process.

Using the SMD process results in pad dimension tolerances of about +/−150 microns, which may be even larger in case of big substrate dimensions.

In some embodiments stencils are used to define the substrate pad and the pad fingers.

It is noted that the NSMD process is typically more accurate than the SMD process, and may be preferable to the SMD process. However, the SMD process is still accurate enough in many cases for defining the body 210 of the substrate pad 201.

It is also noted that the pad fingers 202 may be produced as an extent of the substrate pad material itself, or the shape and size may be defined by a top layer of resist 111 covering a larger substrate pad.

FIG. 2A depicts a case where the body 210 of the substrate pad 201 area is the same as the component pad 203 area, and pad fingers 202 extend symmetrically from opposing side of the substrate pad 201.

When the component pad 203 is placed on the substrate pad 201, molten solder floats the component, and surface tension forces, corresponding to the surface tension force 107 depicted in FIG. 1B, are equal on both sides of the body 210 of the component pad 203, and perfectly align the component pad 203 with the body 210 of the substrate pad 201.

Solder fillets (not shown) are formed on the pad fingers 202.

It is noted that when solder paste is heated, and the solder melts, the solder adheres to the pad area and does not adhere to the non-pad area. When a substrate pad substrate pad has pad fingers, the molten solder flows out along the pad fingers. The pad fingers are thus drains for removing excess solder. In addition, the solder sticks not just to the bottom of contact pads, but also to the vertical sides of the contact pads, as shown in FIGS. 1B and 1C.

It is noted that the solder fillets form a surface of least surface tension.

In prior art the substrate pad is bigger than the contact pad, the solder fillets are all around the circumference of the contact pad, the solder fillets exert equal forces on all sides of the component pad.

In embodiments of the invention, when the substrate pad is same-sized as the component pad, and also has fingers, as in some embodiments of the invention, the solder fillets form on the substrate pad fingers, and not all around the component pad. The solder fillets exert a force on the component pad, as depicted in FIG. 1B. The solder fillets exert a force on the contact pad, while the components is floating on the molten solder, which pulls the contact pad toward the pad fingers until exact alignment of the internal area of the substrate pad is achieved with the bottom of the contact pad. That is a state of least surface tension.

In some embodiments, solder paste is placed on a pad, such as the substrate pad, prior to heating and melting the solder. In some embodiments the components are attached using a reflow soldering method. When solder paste is placed on the pad, a distance from a solder pattern to an edge of the substrate pad is optionally controlled and designed, so that in a reflow time designed, melted solder will reach the pad edge and optionally flow along the pad fingers, potentially enabling self alignment. Some example values of the distance are in the range of 2-20 mils, depending on component weight and geometry.

In some embodiments, solder amount, which is determined by solder pattern dimensions and/or solder thickness, is optionally controlled to provide enough solder to create solder fillets and create enough forces for self alignment. An example value of solder amount for attaching a component pad to a substrate pad is enough for a thickness of the solder bulk after reflow to be 1 mil or over. Optionally plus enough solder to provide for producing solder fillets on pad fingers, where pad fingers are used.

In some embodiments, solder amount is determined such that solder bridges are not created between adjacent pad fingers. Too much solder might bridge separate pad fingers, potentially enabling the component to move onto the pad fingers and negatively impact self alignment.

In some embodiments, a process is used to select a correct amount of solder in order to produce a good contact between the component pad 203 and the substrate pad 201 and in some cases in order to optionally produce right-sized solder fillets on the pad fingers 202 leading from the body of the substrate pad 210. Optionally, an initial estimate is made as to the amount of solder need, based on the size of the component, and/or the area of the component pad 203, and/or optionally some additional amount for producing solder fillets on the pad fingers 202. Optionally, tests are made using variations of solder amount and other parameters in the soldering process, such as, by way of a non limiting example, temperature ramp-up rate, thermal soak zone time, and time above reflow (time above liquidus). Results of using various settings are inspected for soldering defects and/or solder fillet appearance and an optimum amount of solder and/or soldering process settings are determined.

In some embodiments, the width of the pad fingers 202 is designed to be smaller than the width of the spaces between the pad fingers 202.

In some embodiments, a sum of widths of the pad fingers 202 along an edge of the substrate pad 201 is smaller than half of a length of the same edge of the substrate body 210.

Figure 2B:
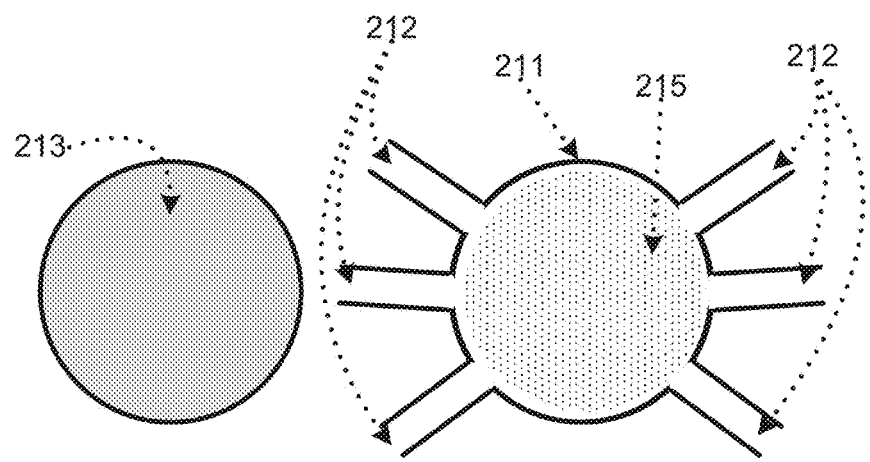
FIG. 2B is a simplified illustration of a component pad and a substrate pad according to another example embodiment of the invention.

Reference is now made to FIG. 2B, which is a simplified illustration of a component pad 213 and a substrate pad 211 according to another example embodiment of the invention.

FIG. 2B depicts a body 215 of the circular substrate pad 211 having a same shape, same area as a component pad 213.

The optional pad fingers 212 are connected to the substrate pad 211, and the pad fingers 212 extend symmetrically from opposing side of the body 215 of the substrate pad 211.

When the circular component pad 213 is placed on the circular substrate pad 211, surface tension forces are equal on both sides of the component pad 213, and perfectly align the component pad 213 with the substrate pad 211.

Solder fillets (not shown) are formed on the pad fingers 212.

Figure 2C:
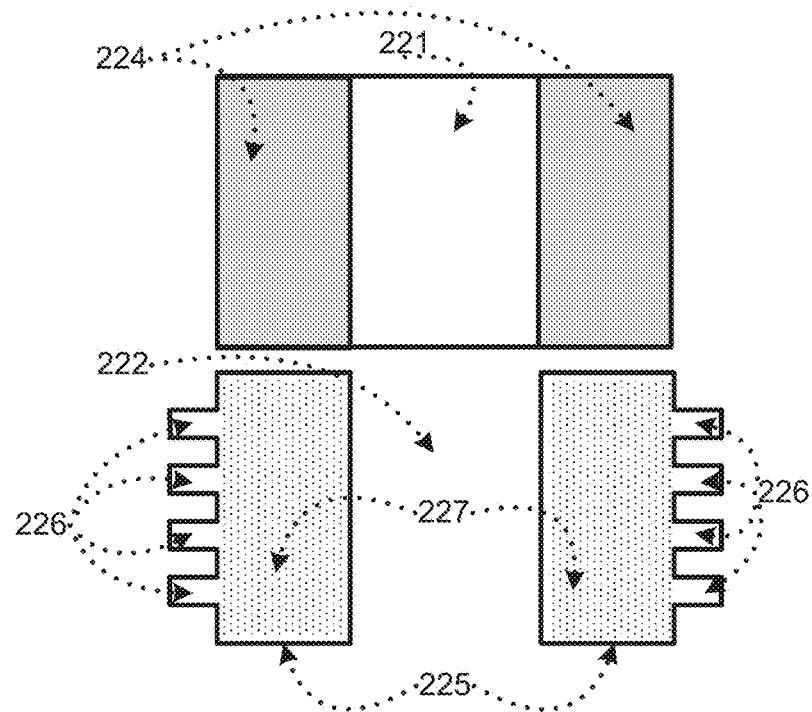
FIG. 2C is a simplified illustration of component pads and substrate pads according to yet another example embodiment of the invention.

Reference is now made to FIG. 2C, which is a simplified illustration of component pads 224 and substrate pads 225 according to yet another example embodiment of the invention.

FIG. 2C depicts a component 221 with two component pads 224, and a substrate 222 with two substrate pads 225 having pad fingers 226.

FIG. 2C depicts bodies 227 of the two substrate pads 225 having a same shape, same area as the component pads 224.

The pad fingers 226 extend to a different side of each of the substrate pads 225. However, when the component 221 is placed on both of the substrate pads 225, the pad fingers 226 are symmetrically arranges on two opposing sides of the component 221, surface tension forces exerted by molten solder are equal on both sides of the component 221, and perfectly align the component pads 224 with the substrate pads 225, thereby perfectly placing the component 221 in its intended place.

Figure 2D:
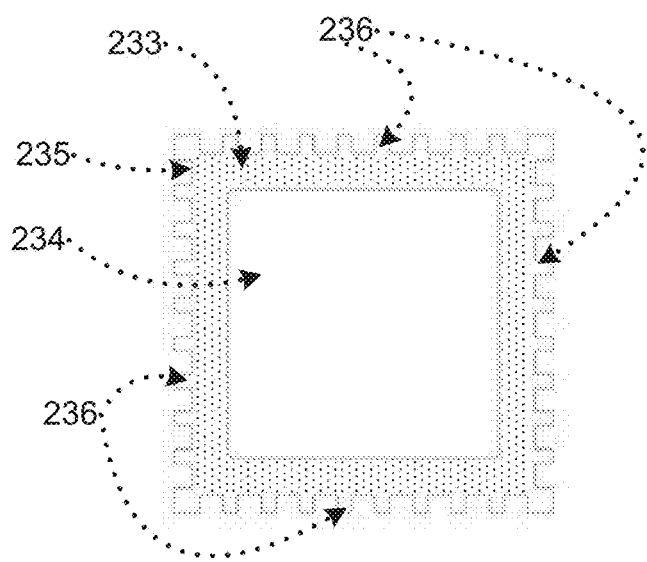
FIG. 2D is a simplified illustration of a substrate pad according to still another example embodiment of the invention.

Reference is now made to FIG. 2D, which is a simplified illustration of a substrate pad according to still another example embodiment of the invention.

FIG. 2D is a top view of a substrate pad 235 shaped as a rectangular frame around a non-pad center 234. Such a substrate pad 235 is optionally suitable for soldering a hollow frame, as will be described below with reference to FIGS. 3E, 3F and 3G.

The substrate pad 235 includes pad fingers 236 all around four sides.

FIG. 2D depicts a hollow rectangular body 233 of the substrate pad 235 having a same shape, same area as the hollow frame which is designed to be soldered to the substrate pad 235.

Figure 2E:
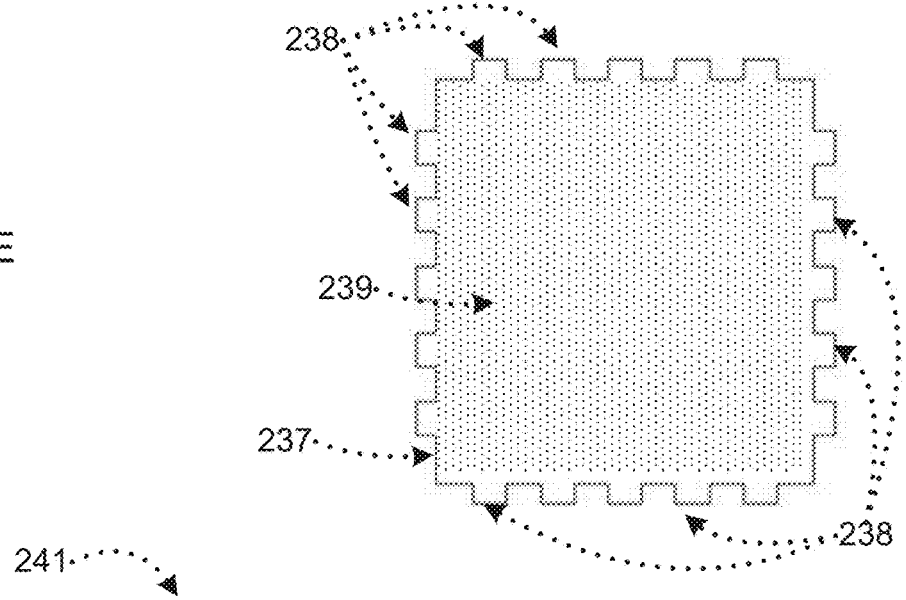
FIG. 2E is a simplified illustration of a substrate pad according to still another example embodiment of the invention.

Reference is now made to FIG. 2E, which is a simplified illustration of a substrate pad according to still another example embodiment of the invention.

FIG. 2E is a top view of a substrate pad 237 shaped as a rectangle having several pad fingers 238 on each side of the rectangle.

FIG. 2E depicts a rectangular body 239 of the substrate pad 237 having a same shape, same area as the component pad which is designed to be soldered to the substrate pad 237.

Figure 2F:
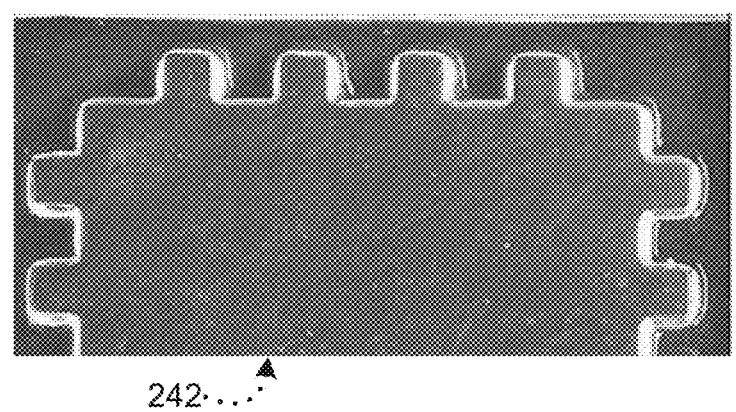
FIG. 2F is a picture of a portion of an actual implementation of a substrate pad according to yet another example embodiment of the invention.

Reference is now made to FIG. 2F, which is a picture 241 of a portion 242 of an actual implementation of a substrate pad according to still another example embodiment of the invention.

FIGS. 2A-2F and their description have illustrated different embodiments of a method of achieving self-alignment of a component to a substrate.

It is noted that two components may be self-aligned to a substrate. Moreover, by self-aligning to the substrate, the two components are aligned to each other via aligning to the substrate.

It is also noted that a first component may be self-aligned to a substrate, and a second component may be soldered in a self-aligned fashion to the first component. Moreover, by self-aligning to the first component, the second component is aligned to the substrate via aligning to the first component.

Some typical production tolerances are now described which illustrate potential accuracy achievable with self-aligned soldering.

Figure 2G:
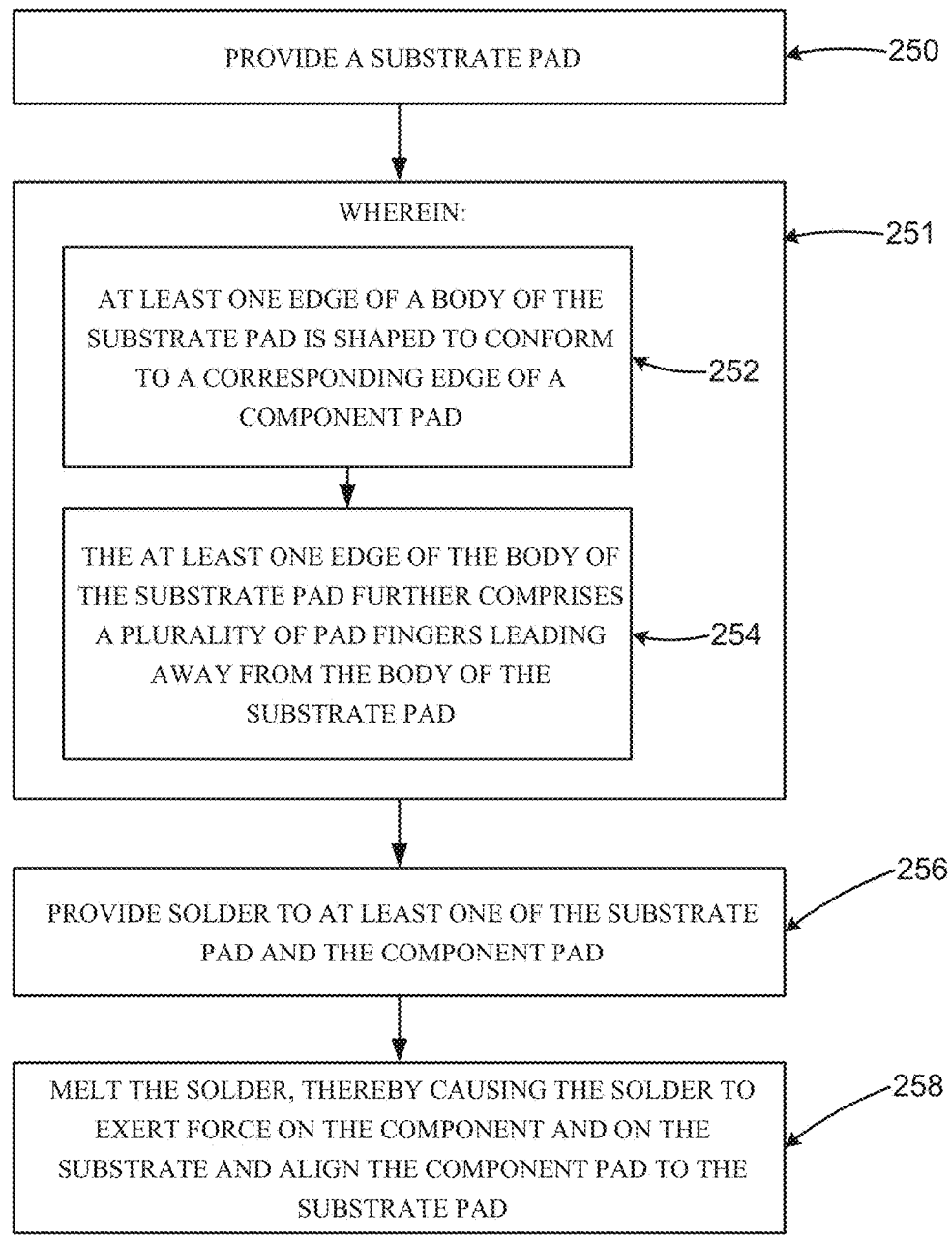
FIG. 2G is a simplified flow chart illustration of a method for producing a substrate pad for soldering a self-aligning component thereon, according to an example embodiment of the invention.

Reference is now made to FIG. 2G, which is a simplified flow chart illustration of a method for attaching and aligning a component to a substrate, according to an example embodiment of the invention.

FIG. 2G illustrates a method for attaching and aligning a component to a substrate, including:
  providing a substrate pad (250), wherein (251):
  at least one edge of a body of the substrate pad is shaped to conform to a corresponding edge of a component pad (252); and
  the at least one edge of the body of the substrate pad further comprises a plurality of pad fingers leading away from the body of the substrate pad (254);
  providing solder to at least one of the substrate pad and the component pad (256); and
  melting the solder, thereby causing the solder to exert force on the component and on the substrate and align the component pad to the substrate pad (258).

Figure 2H:
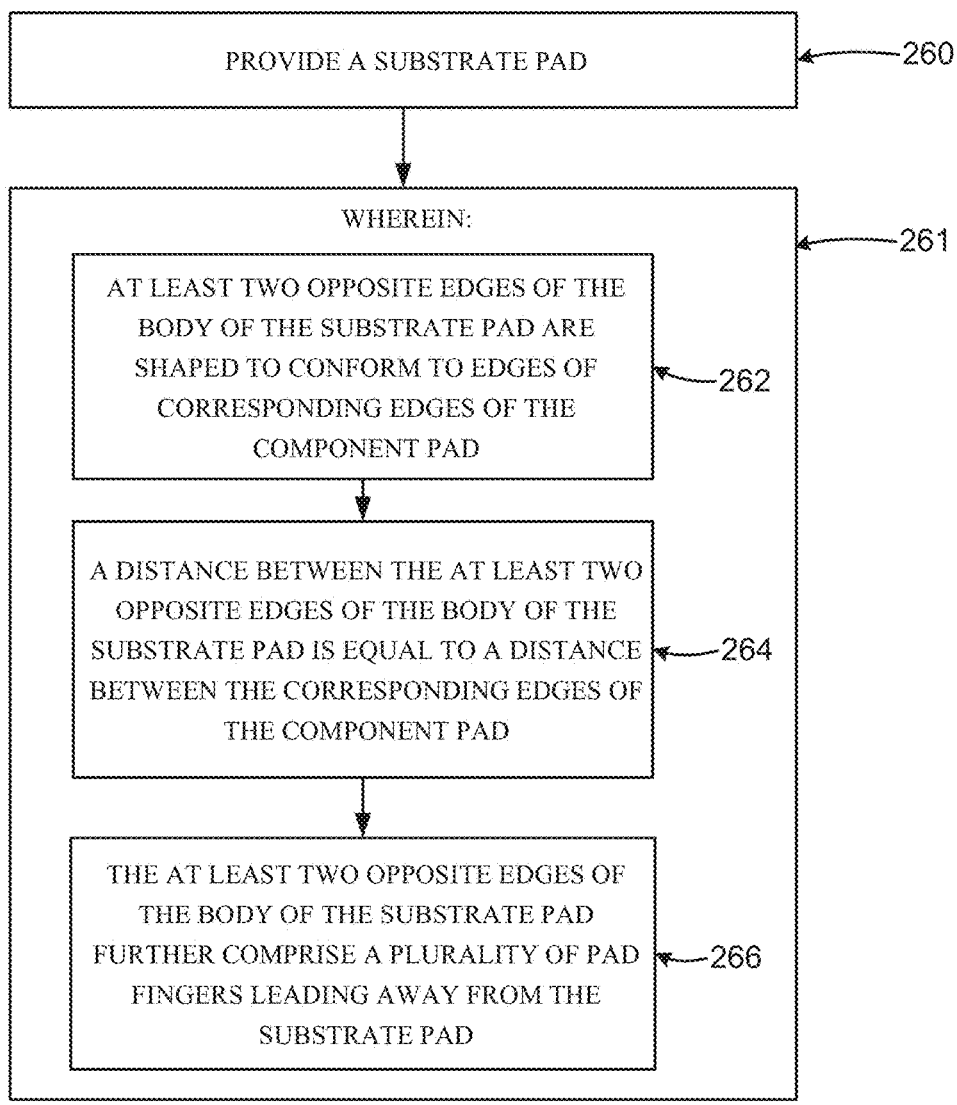
FIG. 2H is a simplified flow chart illustration of a method for attaching and aligning a component to a substrate, according to an example embodiment of the invention.

Reference is now made to FIG. 2H, which is a simplified flow chart illustration of a method for attaching and aligning a component to a substrate, according to an example embodiment of the invention.

FIG. 2H illustrates a method for attaching and aligning a component to a substrate, including:
  providing a substrate pad (260), wherein (261):
  at least two opposite edges of the body of the substrate pad are shaped to conform to edges of corresponding edges of the component pad (262);
  a distance between the at least two opposite edges of the body of the substrate pad is equal to a distance between the corresponding edges of the component pad (264); and
  the at least two opposite edges of the body of the substrate pad further comprise a plurality of pad fingers leading away from the substrate pad (266).

EXAMPLES

Reference is now made to the following examples, which together with the above descriptions illustrate some embodiments of the invention in a non limiting fashion.

An example implementation is now described, which makes use of example embodiments of the invention.

The example implementation is that of producing a concentrated photovoltaic module.

The concentrated photovoltaic module includes primary optics, which concentrate light onto photovoltaic cells. The photovoltaic cell receivers may include secondary optics, which optionally homogenize light distribution, and/or concentrate light still more, onto a photovoltaic cell, which produces the electricity.

Embodiments of the invention which use self-aligning soldering to attach components in the concentrated photovoltaic cell receiver and backplane potentially enable simplified manufacturability of the concentrated photovoltaic cell receiver and backplane.

The self-aligning soldering enables achieving high accuracy between components in an optical train which is crucial for performance. Once high accuracy is achieved between the cell, the secondary optical element and the backplane, tolerances may be loosened at the primary to receiver location as well as module alignment, sun tracking accuracy and so on. A concentrated photovoltaic system has one tolerance budget for the entire system, which is typically derived from the optical train. In High Concentration PhotoVoltaic modules the tolerance budget is typically in the range of 0.5-1.5 degrees acceptance, half angle or angular error limit, while remaining above 90% performance efficiency.

Another advantage which is potentially achieved with an embodiment of the invention is that there is no requirement for special alignment tools or strategies, standard and common SMT and reflow machinery and standard tooling are optionally utilized, such as stencils. Potentially, no additional jigs or active alignment tools are needed.

The primary optics array concentrates light onto several receivers. The primary optics is typically a unit which concentrates light into spots defined by the optics. The secondary optics must be placed accurately into those spots. The accuracy required is high. The backplane is optionally manufactured by a printing process, such as printing a Printed Circuit Board (PCB). The printing process is capable of the accuracy required to maintain the performance of high concentration PV systems.

Attaching CPV receivers onto the substrate is preferably performed by keeping up a high degree of accuracy.

Using a self-aligning soldering method to attach the photovoltaic cells onto the substrate potentially maintains the degree of accuracy required, and can optionally do so even while using inexpensive methods of placing the photovoltaic cells onto the substrate.

In some embodiments, producing the concentrated photovoltaic cell receiver involves assembling the secondary optics onto the photovoltaic cell, and assembling the secondary optics—photovoltaic cell combination onto the substrate.

In some embodiments, producing the concentrated photovoltaic cell receiver involves assembling the photovoltaic cell onto the substrate or carrier, and assembling the secondary optics onto the photovoltaic cells.

In some embodiments, the two assembly stages in both of the above cases are performed using self-aligned soldering, which maintains the desired accuracy.

Reference is now made to FIG. 3A, which is a simplified isometric illustration of a concentrated photovoltaic module 360 designed and constructed according to an example embodiment of the invention.

FIG. 3A depicts primary optics 361, mounted on a primary optics frame 362; a backplane substrate 301; and photovoltaic receivers 302 attached to the backplane substrate 301.

Figure 3B:
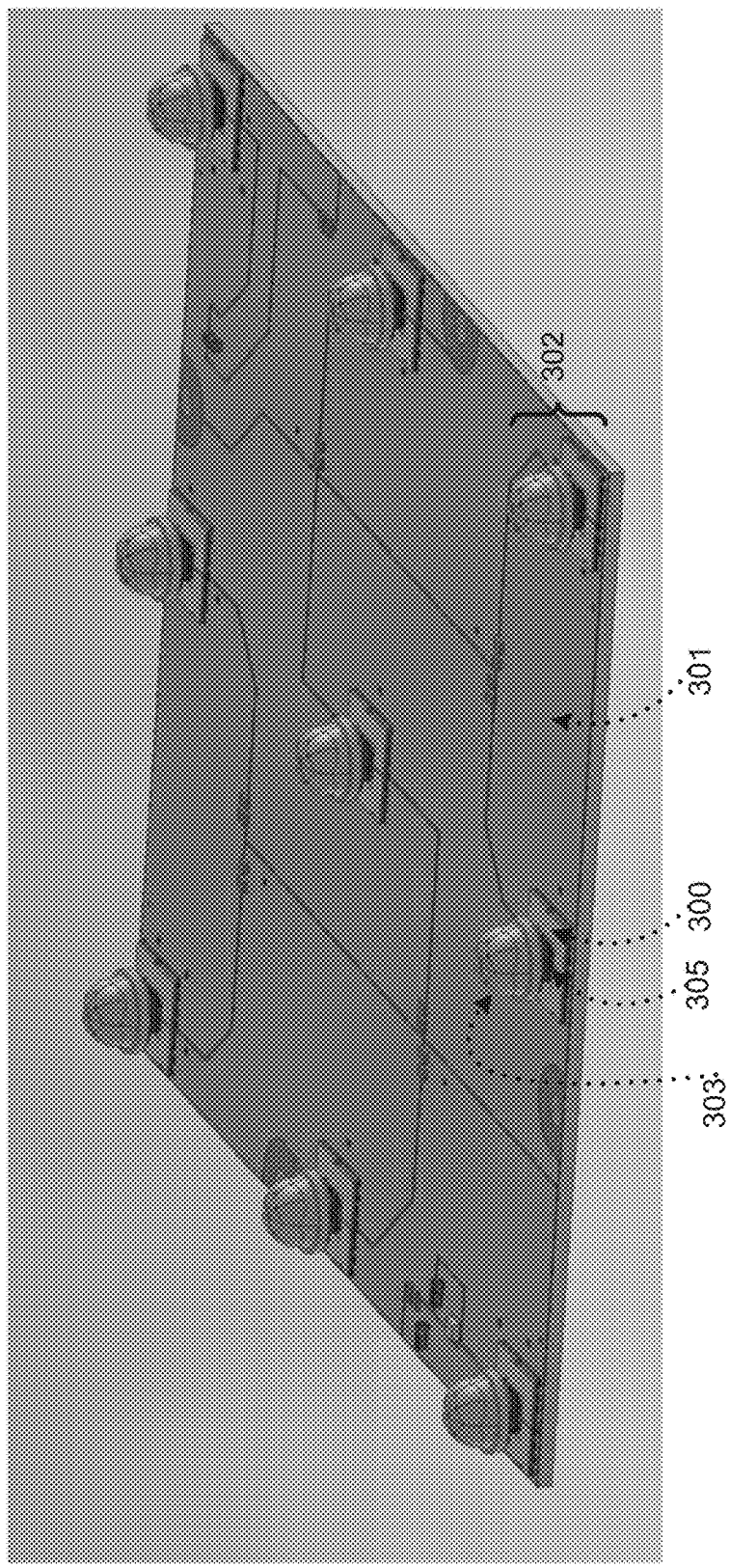
FIG. 3B is a simplified isometric illustration of a substrate with photovoltaic receivers, which include a photovoltaic cell and secondary optical components mounted above the photovoltaic cell, attached to heat-spreaders attached to the substrate, according to an example embodiment of the invention.

Reference is now made to FIG. 3B, which is a simplified isometric illustration of a substrate 301 with photovoltaic receivers 302, which include a photovoltaic cell 305 and secondary optical components 303 mounted above the to photovoltaic cell 305, attached to heat-spreaders 300 attached to the substrate 301, according to an example embodiment of the invention.

FIG. 3B depicts the substrate 301, or backplane, which includes electrical interconnections between photovoltaic receivers 302.

Substrate pad shape for soldering the heat-spreaders 300 to the substrate 301, and substrate pad shape for soldering the photovoltaic receivers 302 to the heat spreaders 300 is optionally defined by the NSMD process mentioned above with reference to FIG. 2A.

In some embodiments, substrate pad and substrate pad finger shape is optionally defined by resist. In such case, and a patterning of a resist layer is what defines the shape of the substrate pads and pad fingers.

Figure 3C:
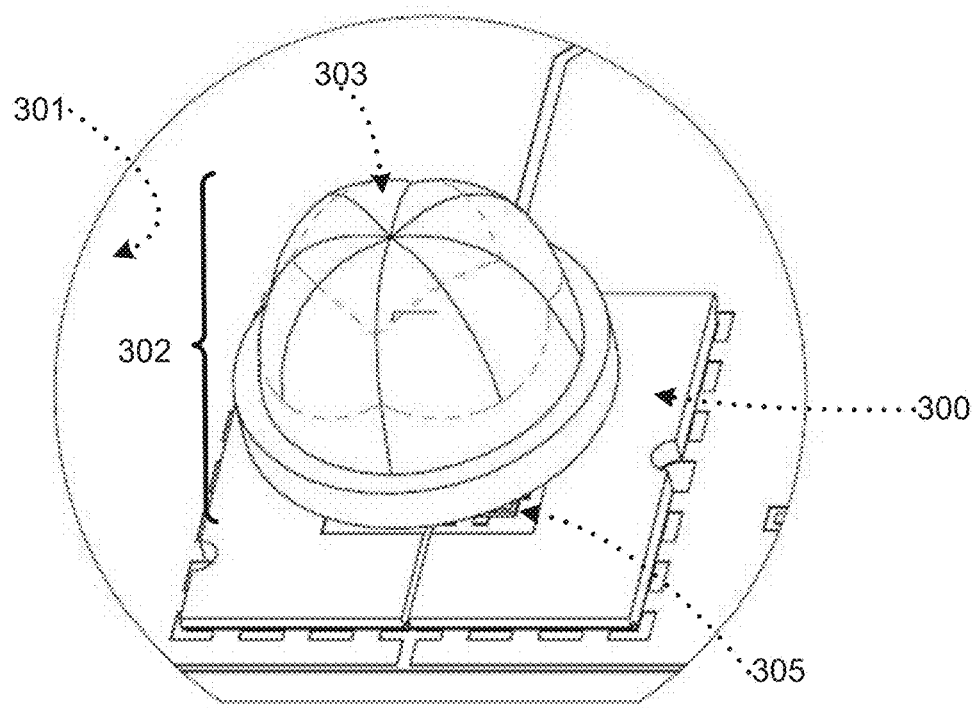
FIG. 3C is a simplified, yet more detailed, isometric illustration of a photovoltaic receiver attached to a heat spreader, which is attached to a substrate, having a secondary optical component over a photovoltaic cell, according to the example embodiment of FIG. 3B.

Reference is now made to FIG. 3C, which is a simplified, yet more detailed, isometric illustration of a photovoltaic receiver 302, attached to a heat spreader 300, which is attached to a substrate 301, and a secondary optical component 303 over the photovoltaic cell 305 according to the example embodiment of FIG. 3B.

FIG. 3C depicts the photovoltaic cell 305 plus the secondary optical component 303 combination, which repeats itself across the substrate, in more detail than FIG. 3B.

Figure 3D:
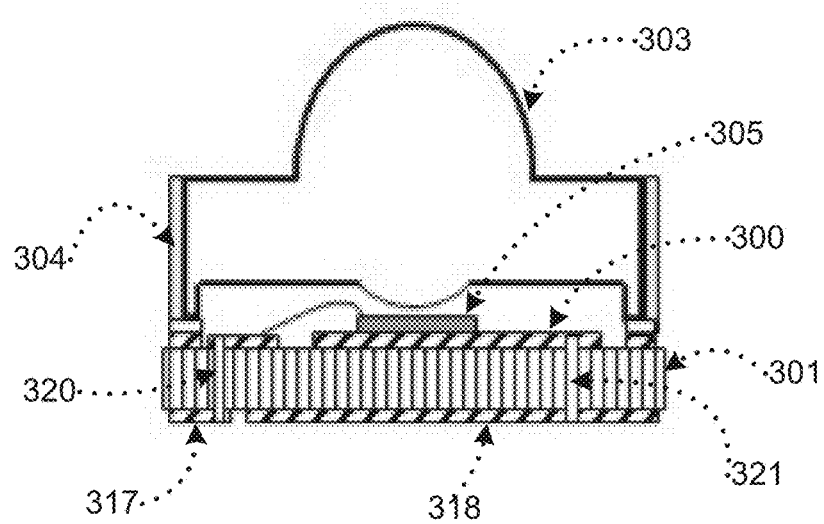
FIG. 3D is a simplified cross sectional illustration of a photovoltaic cell attached to a photovoltaic receiver substrate, and the secondary optical component attached to the photovoltaic receiver substrate, according to the example embodiment of FIG. 3B.

Reference is now made to FIG. 3D, which is a simplified cross sectional illustration of a photovoltaic cell 305 attached to a photovoltaic receiver substrate and the secondary optical component 303 attached to the photovoltaic receiver 302 substrate according to the example embodiment of FIG. 3B.

FIG. 3D depicts the photovoltaic cell 305 attached to the photovoltaic receiver substrate, and, in some embodiments, the attachment is by soldering the photovoltaic cell 305 onto a substrate pad on the photovoltaic receiver substrate designed and produced according to an embodiment of the method of self-aligned soldering.

FIG. 3D also depicts the secondary optical component 303 sitting in or on a frame 304, and the frame 304 is attached to a substrate 301. In some embodiments, the attachment of the frame 304 to the substrate 301 is by soldering the frame 304 onto a substrate pad on the substrate 301 designed and produced according to an embodiment of the method of self-aligned soldering.

The photovoltaic receiver 302 has electrical connection to the photovoltaic cell 305, and includes electrical conductance from two opposite polarity contacts of the photovoltaic cell 305. A top facet of the photovoltaic cell 305 is connected to a terminal 317 of one polarity, optionally by a conducting via 320. A bottom facet of the photovoltaic cell 305 is connected to another terminal 318 of an opposite polarity, via another conducting via 321 which interconnects substrate pad 300 and component pad 318.

Figure 3E:
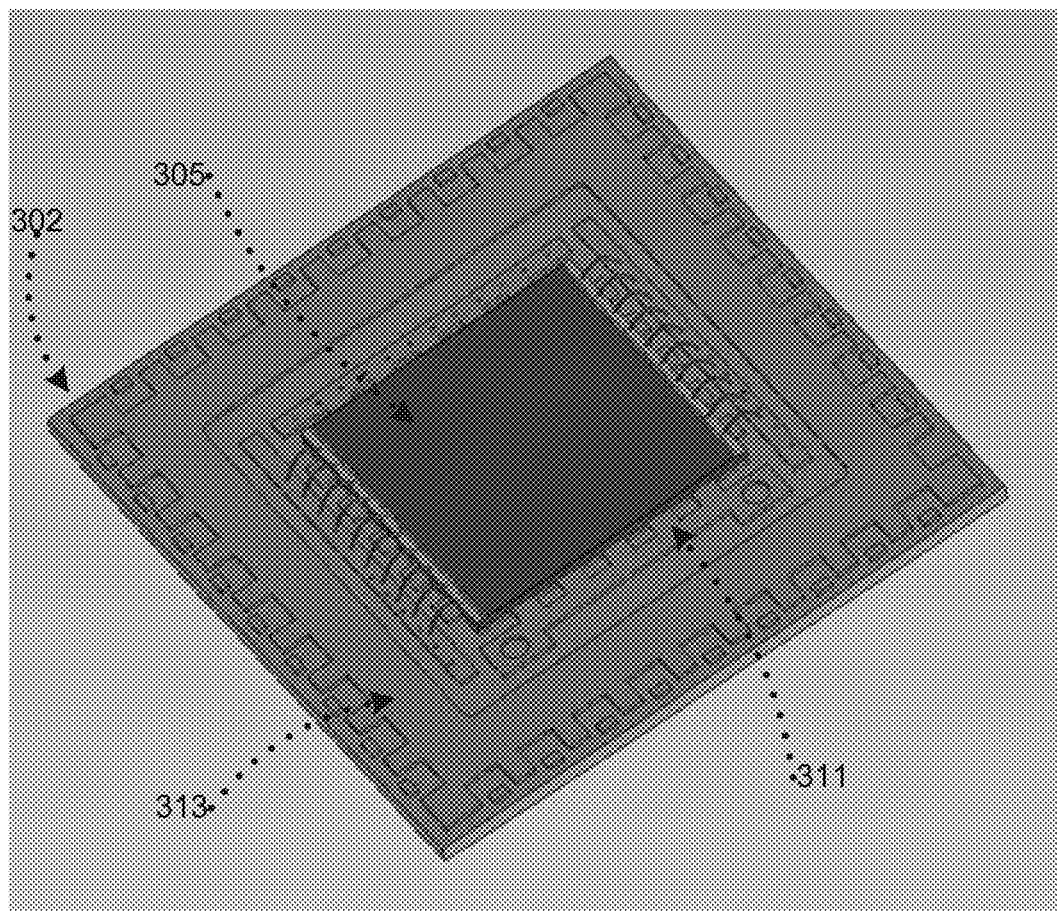
FIG. 3E is a simplified isometric illustration of a photovoltaic cell of FIG. 3D attached to a substrate of the photovoltaic receiver according to the example embodiment of FIG. 3B.

Reference is now made to FIG. 3E, which is a simplified isometric illustration of a photovoltaic cell 305 of FIG. 3D attached to a substrate of the photovoltaic receiver 302 according to the example embodiment of FIG. 3B.

FIG. 3E depicts a substrate pad extension 311 shaped to connect the photovoltaic cell 305 to the vias 320 321 of FIG. 3D.

In the example embodiment of FIG. 3E there are two pads, a first pad is an internal pad for the photovoltaic cell 305 (not seen, being covered by the photovoltaic cell 305), and a second substrate pad 313 is a circumferential pad for a lens holder frame for secondary optics, to be soldered thereon in a self-aligning fashion.

The substrate pad 311 and the substrate pad 313 are aligned with each other to a degree of accuracy achievable by printing the substrate pads of the substrate of the photovoltaic receiver 302, optionally on a PCB.

The secondary optics frame (not shown) and the photovoltaic cell 305 are aligned with each other to a degree achieved by the printing of the photovoltaic receiver substrate pads and the self-aligned soldering, a degree similar to that which could be achieved by using a machine capable of accurate placement such as optical active alignment, which is an expensive machine, or by using a machine which uses some form of feedback to perform the alignment, optionally additionally to machine vision capabilities of standard SMT machines, which is also expensive. Using optical active alignment, or using a machine which uses some form of feedback to perform alignment also requires more time in production, which contributes to system cost.

It is noted that even if accurate placement using the above-mentioned expensive methods is used, and even if the placement accuracy is considered as close to 0 microns, still, during the reflow or curing processes, components tends to move due to surface tension forces, so the placement accuracy will be disturbed, influencing final assembly tolerances.

Figure 3F:
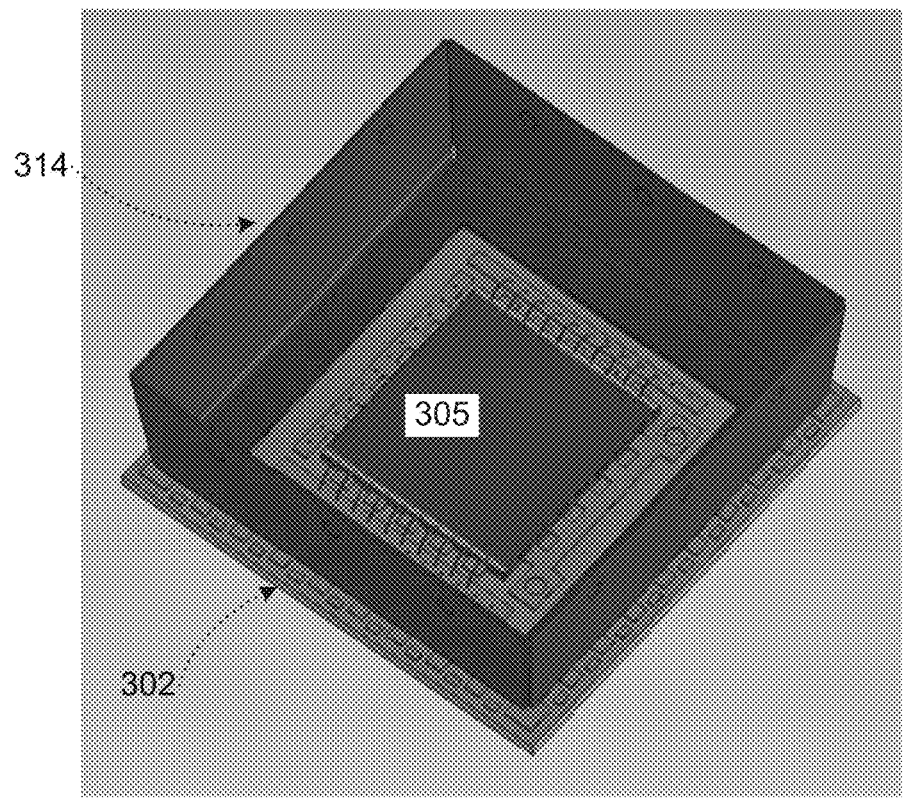
FIG. 3F is a simplified isometric illustration of a frame on which a secondary optical component may be mounted, and a photovoltaic cell, both attached to the photovoltaic receiver substrate according to the example embodiment of FIG. 3B.

Reference is now made to FIG. 3F, which is a simplified isometric illustration of a frame 314 on which a secondary optical component (not shown) may be mounted, and a photovoltaic cell 305, both attached to the photovoltaic receiver 302 substrate according to the example embodiment of FIG. 3B.

The secondary optics frame 314 and the photovoltaic receiver 302 are aligned with each other to a degree achieved by the optional electroplating of the substrate pads on the PCB substrate and the degree achieved by self-aligned soldering.

Figure 3G:
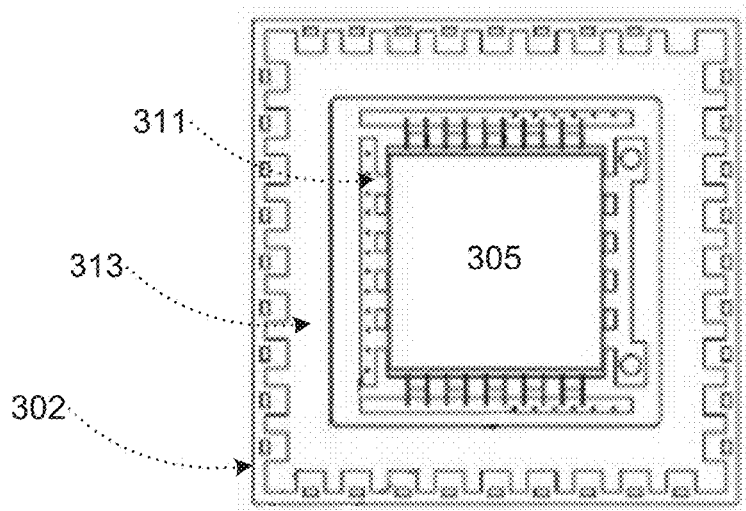
FIG. 3G is a simplified top view illustration of the photovoltaic cell of FIG. 3D attached to the photovoltaic receiver substrate according to the example embodiment of FIG. 3B.

Reference is now made to FIG. 3G, which is a simplified top view illustration of the photovoltaic cell 305 attached to the photovoltaic receiver 302 substrate according to the example embodiment of FIG. 3B.

The top view depicts clearly a substrate pad 311 shaped for the photovoltaic cell 305 to be soldered thereon in a self-aligning fashion, and a substrate pad 313 shaped for the secondary optics frame 314 of FIG. 3F (not shown), to be soldered thereon in a self-aligning fashion.

The substrate pad 311 and the substrate pad 313 are aligned with each other to a degree of accuracy achievable by optionally electroplating the substrate pads 311 313 on the photovoltaic receiver 302, optionally on a PCB.

Figure 3H:
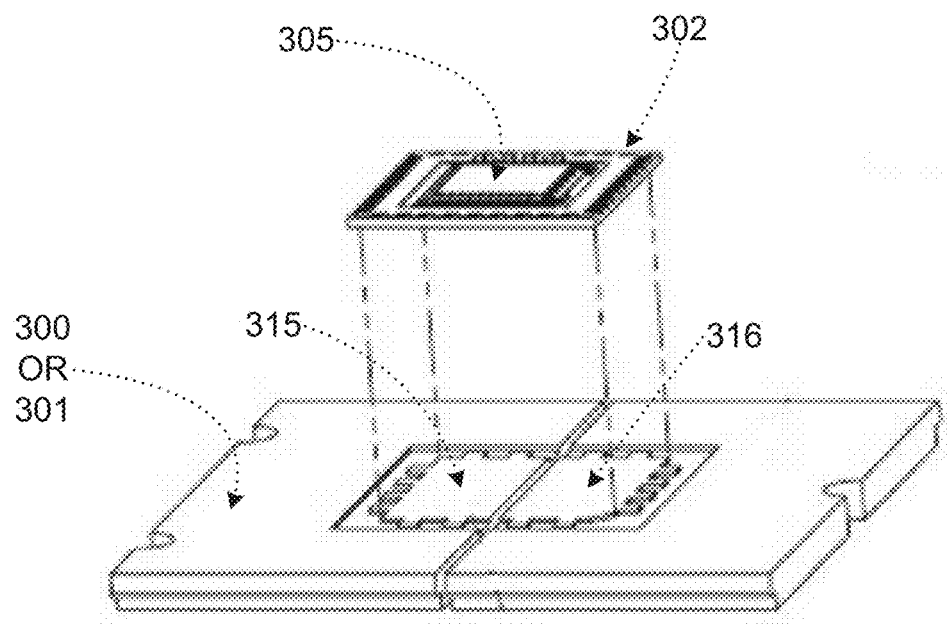
FIG. 3H is a simplified isometric illustration of a substrate of the photovoltaic receiver, and of substrate pads, either on a heat spreader for mounting onto a backplane substrate, or directly on a backplane substrate, according to the example embodiment of FIG. 3B.

Reference is now made to FIG. 3H, which is a simplified isometric illustration of a substrate of the photovoltaic receiver 302, and of substrate pads 315 316, either on a heat spreader 300 for mounting onto a backplane substrate 301, or directly on a backplane substrate 301, according to the example embodiment of FIG. 3B.

It is noted that in some embodiments, the substrate of the photovoltaic receiver 302 is mounted on the heat spreader 300, as also depicted in FIG. 3C.

It is noted that in some embodiments, the substrate of the photovoltaic receiver 302 is mounted directly on the substrate 301.

FIG. 3H also depicts the photovoltaic cell 305 attached to the substrate of the photovoltaic receiver 302.

FIG. 3H depicts two substrate pads 315 316, which correspond to the bottom component pads of the substrate of the photovoltaic receiver 302 by being, apart from having pad fingers, the same size and shape as the bottom component pads of the substrate of the photovoltaic receiver 302.

Figure 3I:
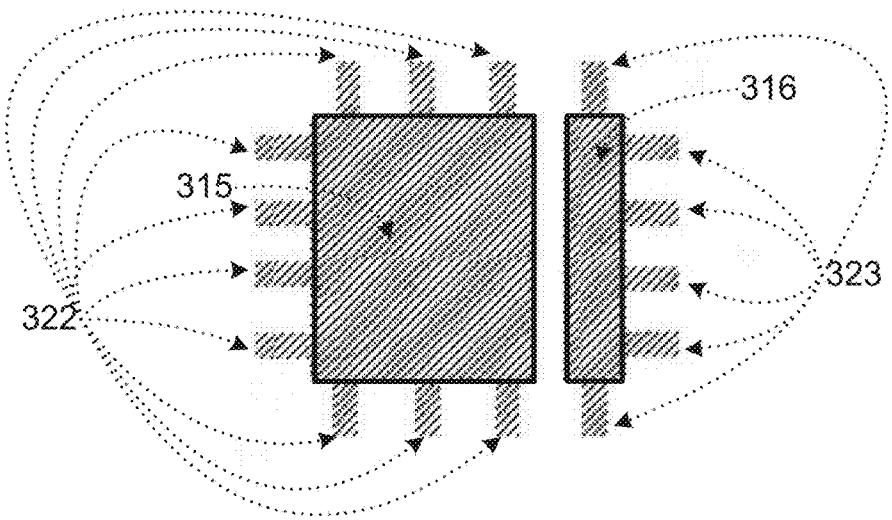
FIG. 3I is a simplified top view illustration of substrate pads on the heat spreader substrate according to an example embodiment of the invention.

Reference is now made to FIG. 3I, which is a simplified top view illustration of substrate pads 315 316 on the heat spreader 300 substrate according to an example embodiment of the invention.

It is noted that the pads 315 316 in FIG. 3I are not equal sized. A first pad 315 part is bigger than the second pad 316. In the example of FIG. 3I, the bodies of the pads 315 316 are equal to the bodies of the component which is soldered onto them, and pad fingers 322 323 extend from the external contour of the bodies of the pads 315 316. This provides self alignment of the component onto the two pads 315 316.

FIGS. 3A-3I have described a case of attaching a photovoltaic receiver 302 onto a backplane substrate, and attaching a photovoltaic cell and a frame mounting secondary optics onto the photovoltaic receiver 302.

FIGS. 3A-3I have also described an optional case of attaching a photovoltaic receiver 302 onto a heat spreader 300, and attaching a photovoltaic cell and a frame mounting secondary optics onto the photovoltaic receiver 302.

Persons skilled in the art will appreciate that other attachment possibilities exist, which also use the self-aligned soldering, to attach a solar cell and a frame mounting secondary optics onto a backplane substrate.

In some embodiments, substrate pads are produced on the backplane substrate, for attaching the solar cell and the frame mounting the secondary optics directly onto a backplane substrate. In such embodiments, the accuracy of relative alignment of the secondary optics to the solar cell and to the primary optics is maintained.

In some embodiments, a solar cell is optionally self-aligned soldered to a solar cell receiver, and the solar cell receiver and the frame for secondary optics are self-aligned soldered onto the backplane substrate. In such embodiments, the accuracy of relative alignment of the secondary optics to the solar cell and to the primary optics is still maintained.

In some embodiments, a solar cell is optionally self-aligned soldered to a solar cell receiver, and the solar cell receiver and the frame for secondary optics are self-aligned soldered onto the heat spreaders which are self-aligned soldered to the backplane substrate. In such embodiments, the accuracy of relative alignment of the secondary optics to the solar cell and to the primary optics is still maintained.

Some potential advantages of the above-described techniques are now described.

In some embodiments, industry standard semiconductor, microelectronic and SMT technologies are utilized for the production and assembly of a receiver and backplane for Concentrated Photovoltaic (CPV) applications. Low cost of production and assembly is maintained, due to the availability of these technologies, their track record and reliable output.

Production scale up in centralized and distributed locations; e.g. in a country where the CPV applications are produced and/or assembled, is made more feasible by using industry standard techniques, and self-alignment enables the production and assembly to be performed with simpler tools.

In some embodiments, the solar cell receiver, such as the solar cell receiver 302, is designed as a standard SMT component.

In some embodiments, presence of electrical pads on the bottom of the solar cell receiver surface allows for standard SMT assembly processes.

In some embodiments, standard pick and place tools and machines are suitable for placing assembly components onto their substrates, in all the different component-substrate combinations described above.

In some embodiments, the components, such as the solar cell receiver 302, are optionally compatible with packaging configurations used by the SMT industry, such as tape and reel, trays etc.

In some embodiments, the components for the CPV application are designed to be produced of proven materials which are known as stable for highly intense UV radiation and high temperature, such as $Al_2O_3$, AlN, BeO, Glass, Copper, Nickel, Palladium, Gold, Aluminum, Silicone, Alloy-42 etc.

Figure 3J:
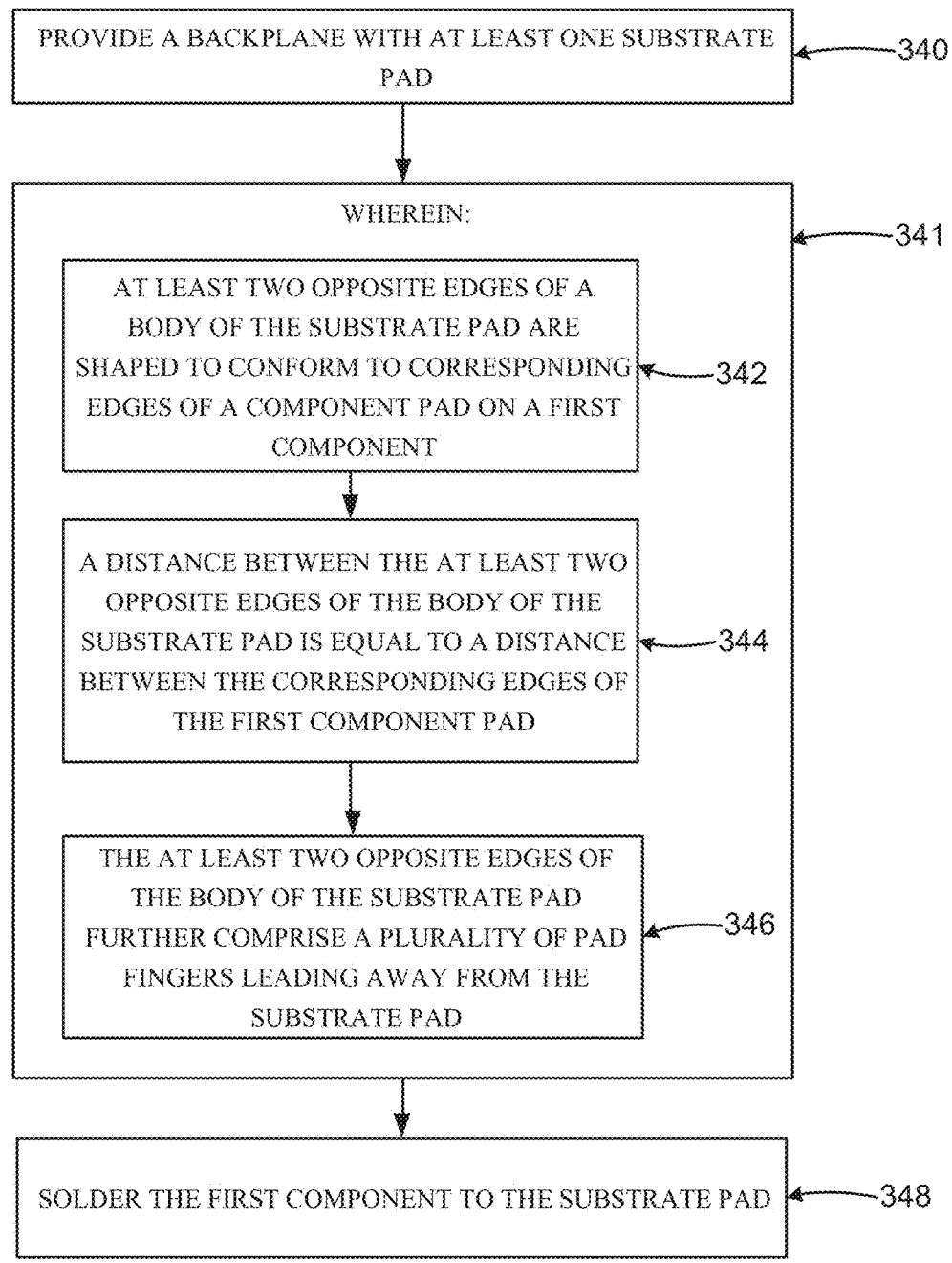
FIG. 3J is a simplified flow chart illustration of a method of assembling a portion of a concentrated photovoltaic module, according to an example embodiment of the invention.

Reference is now made to FIG. 3J, which is a simplified flow chart illustration of a method of assembling a portion of a concentrated photovoltaic module, according to an example embodiment of the invention.

FIG. 3J illustrates a method of assembling a concentrated photovoltaic module, including:

providing a backplane with at least one substrate pad (340), wherein (341):

at least two opposite edges of a body of the substrate pad are shaped to conform to corresponding edges of a component pad on a first component (342);

a distance between the at least two opposite edges of the body of the substrate pad is equal to a distance between the corresponding edges of the first component pad (344); and the at least two opposite edges of the body of the substrate pad further comprise a plurality of pad fingers leading away from the substrate pad (346), and soldering the first component to the substrate pad (348).

It is noted that since both the body of the substrate pad and the component pad are each manufactured within specific engineering tolerances, absolute equality may not be achieved.

In some embodiment, the substrate pad is manufactured to be equal or slightly larger than the component pad, taking into account manufacturing tolerances of both. When the substrate pad is slightly bigger, the component may create small fillets between the component pad and the substrate pad, and the influence on alignment of the slightly larger substrate pad is lessened. On the other hand, if the substrate pad were made smaller than the component pad, the component may potentially be aligned according to one of the substrate pad edges, which might cause a slight misalignment.

Some non-limiting examples of nominal substrate pad and component pad dimensions are provided below:

(1) The backplane (such as substrate 301 of FIG. 3B) substrate pad is optionally larger than the bottom of the heat spreader (300 in FIG. 3B) by 50 microns.

(2) In case of a DPC (Dual Plated Copper) ceramic substrate, the substrate pad is optionally larger than the bottom of the solar cell by 20 microns.

(3) Top heat spreader substrate pad is identical to bottom of component DPC pad (nominal dimension).

Some non-limiting examples of pad tolerances are:

(1) Pad dimensions on a ceramic substrate (e.g. for solar cell and frame assembly) 0.2-3 microns—which is considered a zero tolerance (electroplating process).

(2) Pad dimensions for a solar cell are +/−20 microns (dicing process).

(3) Pad dimensions for a backplane −0/+50 microns (etching process).

(4) Pad dimensions for a frame is +/−50 microns (punch+bending).

(5) Bottom pad dimensions for a heat spreader are +/−100 microns. These dimensions may optionally be improved by alternative manufacturing processes, for a target pad tolerance of 50 microns. Such a manufacturing process may optionally be blind routing+CNC, and/or a punch process).

(6) The top substrate pad dimensions for a heat spreader is 50 microns (etching process).

In some embodiments, assembly accuracy is held to be, by way of a non-limiting example:

(1) Solar cell to substrate registration is +/−10 microns. In some embodiments, using alternative, non-self-aligning processes, the registration is 150-200 microns. In order to improve registration in case of the alternative, non-self-aligning processes, it is enough to define pads with a solder mask, and/or not to prevent solar cell movement during a solder reflow process.

Figure 3K:
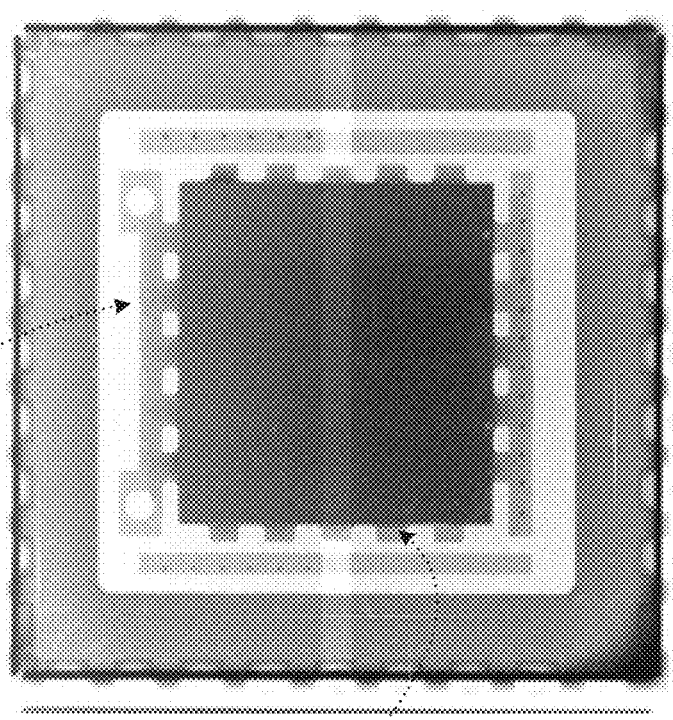
FIG. 3K is an image of a solar cell aligned to a substrate according to an example embodiment of the invention.

Reference is now made to FIG. 3K which is an image of a solar cell 305 aligned to a substrate 371 according to an example embodiment of the invention.

(2) Frame to substrate registration is +/−1030 microns.

Figure 3L:
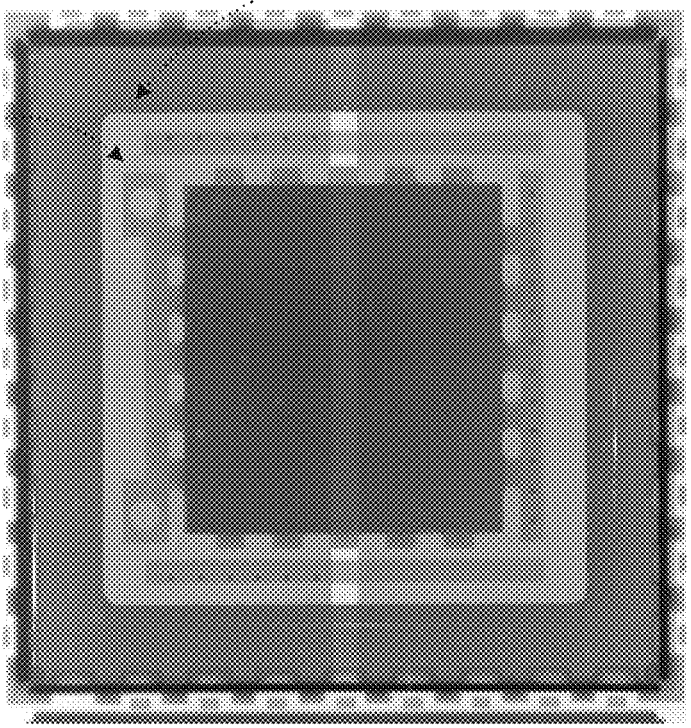
FIG. 3L which is an image of a frame aligned to a substrate according to an example embodiment of the invention.

Reference is now made to FIG. 3L which is an image of a frame 373 aligned to a substrate 371 according to an example embodiment of the invention.

(3) Heat spreader to backplane is +/−50-100 microns. Using alternative, non-self-aligned processes, assembly accuracy may be +/−300-500 microns, caused by component tolerance+solder mask tolerance+bigger pad. If using any additional mechanical fixtures to hold the assembly during reflow, the assembly accuracy of the non-self-aligned process may be improved a little bit.

Figure 3M:
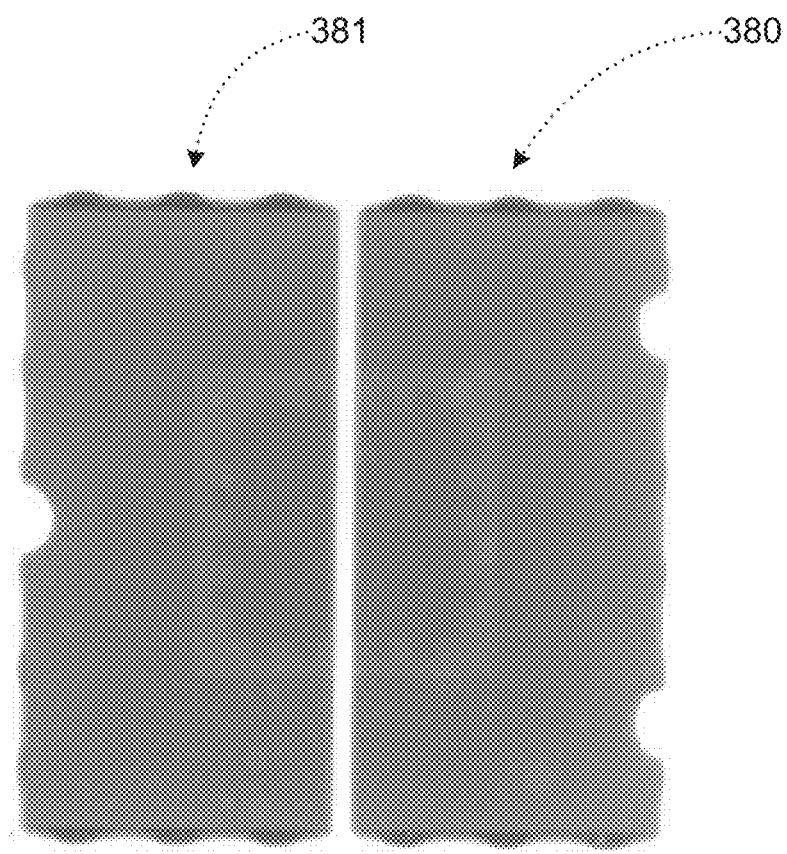
FIG. 3M is an image of heat spreader to heat spreader alignment when soldered onto substrate pads on a substrate backplane according to an example embodiment of the invention.

Reference is now made to FIG. 3M which is an image of heat spreader 380 to heat spreader 381 alignment when soldered onto substrate pads (not shown) on a substrate backplane according to an example embodiment of the invention.

FIG. 3M depicts a result of self-aligned soldering of two separately assembled components (in this case heat spreaders 380 381) when the alignment between the two is a design consideration. The alignment of the heat spreaders 380 381 is FIG. 3M.

(4) Bottom receiver pad to top heat spreader pad is in the range of +/−20-30 microns.

It is noted that the above example description of self-aligned soldering components to a substrate easily applies to self-aligned soldering of LEDs, lasers, CMOS receivers, and other such components, especially optical components but other types too, to substrates, especially when the components need to be aligned to the substrate and/or to each other within the tight tolerances described above.

It is expected that during the life of a patent maturing from this application many relevant soldering technologies, Surface Mount Technologies, solder materials, solder paste materials and pad materials will be developed and the scope of the terms soldering technologies, Surface Mount Technologies, solder materials, solder paste materials and pad materials are intended to include all such new technologies a priori.

The terms "comprising", "including", "having" and their conjugates mean "including but not limited to".

The term "consisting of" is intended to mean "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a unit" or "at least one unit" may include a plurality of units, including combinations thereof.

The words "example" and "exemplary" are used herein to mean "serving as an example, instance or illustration". Any embodiment described as an "example or "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A component and a substrate for soldering the component thereon, comprising:
　a component comprising a component pad terminal on the component for soldering onto a substrate pad; and a substrate comprising a substrate pad for soldering the component thereon, wherein the substrate pad comprises a main body having an oval shape and substrate pad fingers leading away from edges of the main body; wherein:

the size and area and shape of the component pad is equal to the size and area and shape of the main body of the substrate pad;

the edges of the body of the oval substrate pad are shaped to conform to corresponding edges of the oval component pad; and a sum of widths of the pad fingers along an edge of the body of the oval substrate pad is smaller than half of a length of the same edge of the body of the oval substrate pad.

2. A component and a substrate for soldering the component thereon, comprising:

a component comprising a component pad terminal on the component for soldering onto a substrate pad; and a substrate comprising a substrate pad for soldering the component thereon, wherein the substrate pad comprises a main body having a polygonal shape and substrate pad fingers leading away from at least two edges of the main body;

wherein the size and area and shape of the component pad is equal to the size and area and shape of the main body of the substrate pad; and a sum of widths of the pad fingers along an edge of the main body of the substrate pad is smaller than half of a length of the same edge of the main body of the substrate pad.

3. The substrate of claim 2 in which:

the at least two edges of the body of the substrate pad comprise at least two opposite edges.

4. The substrate of claim 2 in which a width of the pad fingers is smaller than a width of a space between two pad fingers.

5. The substrate of claim 2 in which the substrate pad has room for solder fillets on the pad fingers.

6. The substrate of claim 2 in which there are pad fingers on three edges of the body of the substrate pad.

7. The substrate of claim 2 in which the body of the substrate pad is a rectangle.

8. The substrate of claim 2 in which the at least two edges of the body of the substrate pad comprise at least two adjacent edges.

9. The substrate of claim 2 in which the body of the substrate pad is a rectangle and there are pad fingers on all four edges of the body of the substrate pad.

* * * * *